(12) United States Patent
Tanaka et al.

(10) Patent No.: US 9,742,090 B2
(45) Date of Patent: Aug. 22, 2017

(54) CONTACT

(71) Applicant: FUJITSU COMPONENT LIMITED, Tokyo (JP)

(72) Inventors: Tetsugaku Tanaka, Tokyo (JP); Takahiro Kondo, Tokyo (JP); Koki Sato, Tokyo (JP); Mitsuru Kobayashi, Tokyo (JP)

(73) Assignee: FUJITSU COMPONENT LIMITED, Tokyo (JP)

( * ) Notice: Subject to any disclaimer, the term of this patent is extended or adjusted under 35 U.S.C. 154(b) by 0 days.

(21) Appl. No.: 15/169,911

(22) Filed: Jun. 1, 2016

(65) Prior Publication Data

US 2017/0005426 A1    Jan. 5, 2017

(30) Foreign Application Priority Data

Jul. 1, 2015    (JP) .................................. 2015-133044

(51) Int. Cl.
| | | |
|---|---|---|
| *H01R 13/24* | (2006.01) | |
| *H01R 13/20* | (2006.01) | |
| *G01R 1/04* | (2006.01) | |

(52) U.S. Cl.
CPC .......... *H01R 13/20* (2013.01); *G01R 1/0416* (2013.01); *H01R 13/24* (2013.01)

(58) Field of Classification Search
CPC ............................. H01R 13/20; G01R 1/0416
USPC ........................................ 439/824, 700, 289
See application file for complete search history.

(56) References Cited

U.S. PATENT DOCUMENTS

| | | | | |
|---|---|---|---|---|
| 5,009,613 A * | 4/1991 | Langgard | ........... | G01R 1/06722 439/482 |
| 7,485,011 B2 * | 2/2009 | Hsu | ......... | H01R 12/58 439/700 |
| 7,545,159 B2 * | 6/2009 | Winter | ............... | G01R 1/06733 324/755.05 |
| 7,789,671 B2 * | 9/2010 | Hsieh | ................. | G01R 1/06722 439/66 |
| 7,815,440 B2 * | 10/2010 | Hsieh | ................. | H01R 13/2421 439/66 |
| 8,105,119 B2 * | 1/2012 | Swart | ................. | G01R 1/06722 439/816 |
| 2006/0279301 A1 * | 12/2006 | Treibergs | ............. | G01R 1/0466 324/754.05 |
| 2011/0230105 A1 * | 9/2011 | Hsu | ..................... | G01R 1/0466 439/824 |

(Continued)

FOREIGN PATENT DOCUMENTS

| | | |
|---|---|---|
| JP | 2007-024664 | 2/2007 |
| JP | 2009-128211 | 6/2009 |
| JP | 2013-217800 | 10/2013 |

*Primary Examiner* — Abdullah Riyami
*Assistant Examiner* — Nelson R Burgos-Guntin
(74) *Attorney, Agent, or Firm* — IPUSA, PLLC

(57) ABSTRACT

A contact includes a first terminal including a plurality of arms; a second terminal; a spring connecting the arms to the second terminal; and a casing covering the spring, wherein the arms outwardly protrude from one end of the casing, wherein an interval between the arms increases from a side of the casing to front edges of the arms, wherein when the arms are pushed toward the casing the arms are retracted into the casing and contact an inner side of the casing so that the interval between the arms decreases.

5 Claims, 25 Drawing Sheets

(56) References Cited

U.S. PATENT DOCUMENTS

| | | | | |
|---|---|---|---|---|
| 2012/0171907 A1* | 7/2012 | Rathburn | ............... | H01R 12/52 |
| | | | | 439/700 |
| 2014/0227912 A1* | 8/2014 | Sakai | ................. | H01R 13/2428 |
| | | | | 439/700 |
| 2014/0235112 A1* | 8/2014 | Sakai | ................. | H01R 13/2428 |
| | | | | 439/824 |
| 2017/0005426 A1* | 1/2017 | Tanaka | | |

* cited by examiner

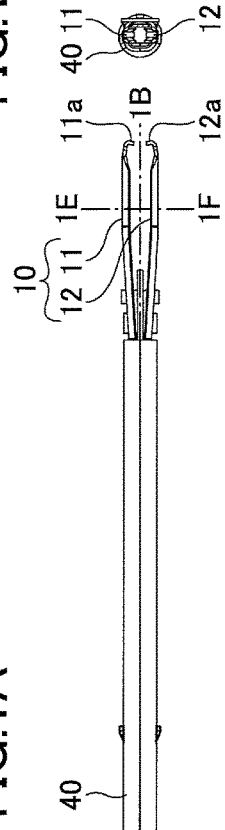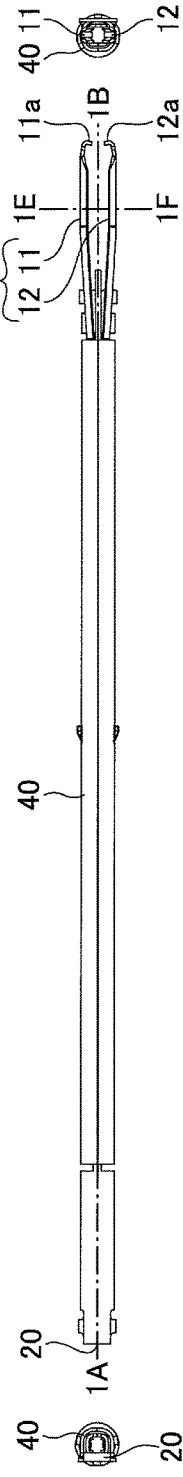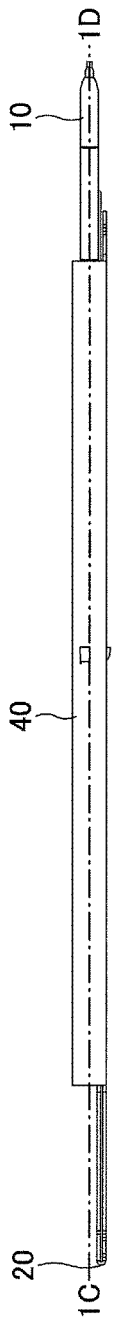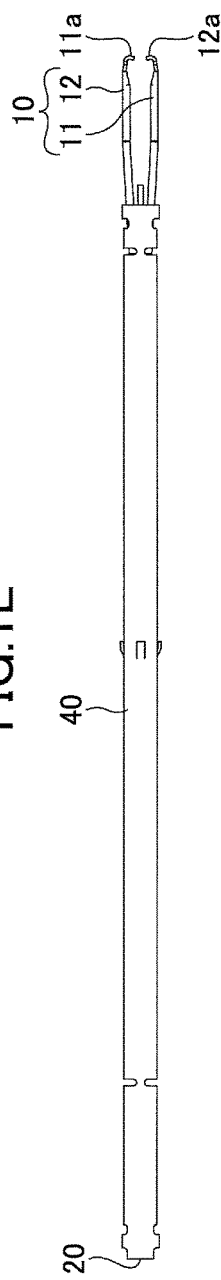
FIG.1A  FIG.1B  FIG.1D  FIG.1E  FIG.1C

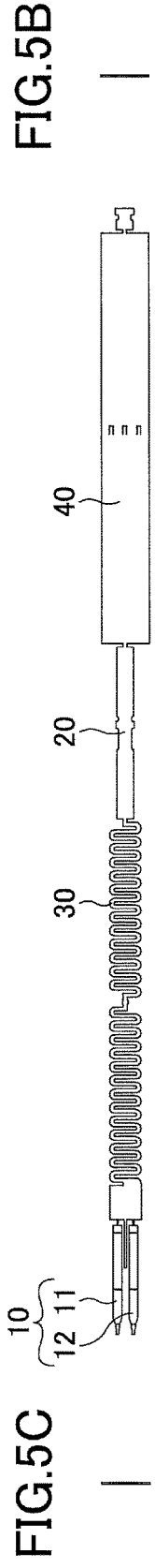
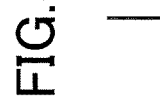

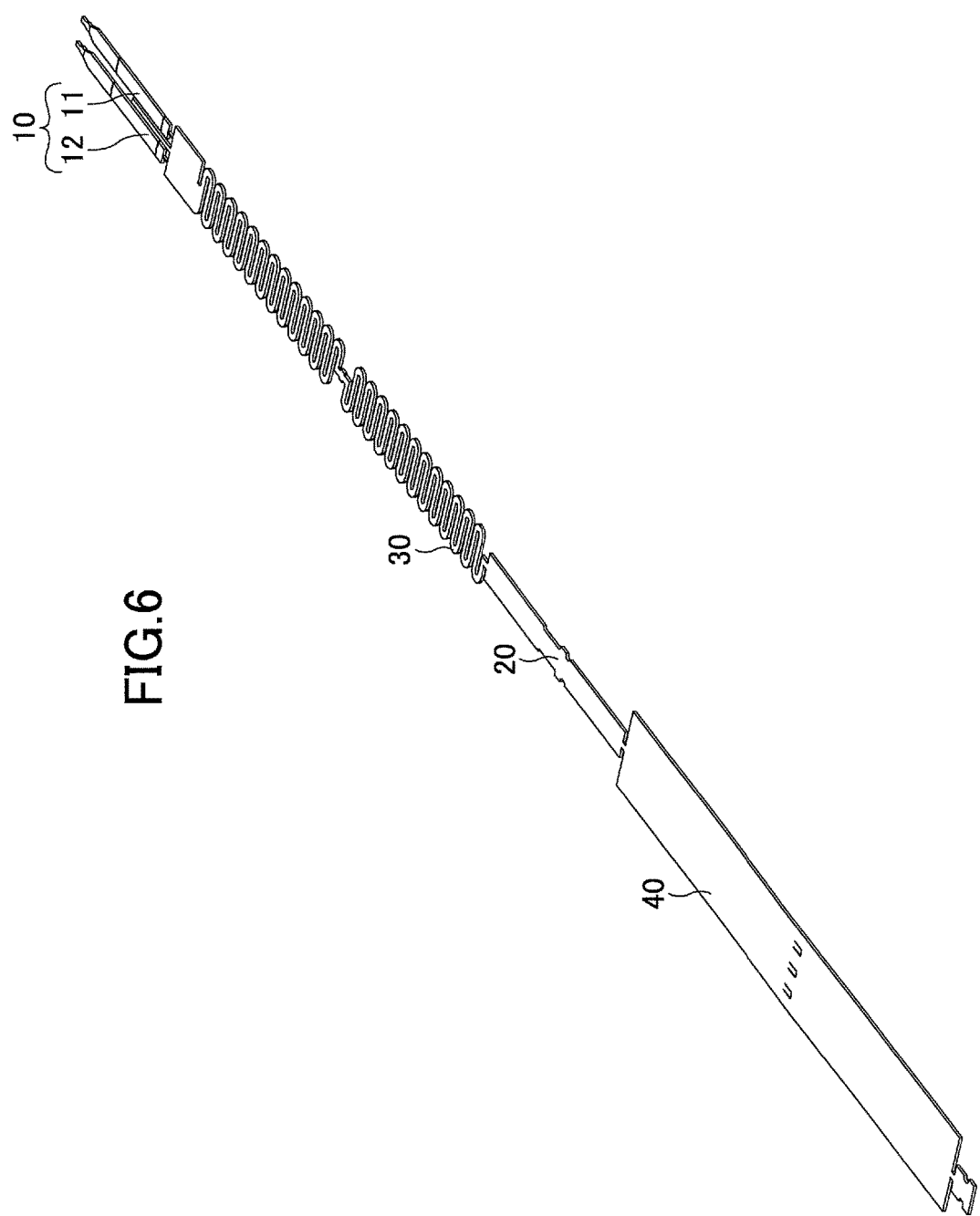

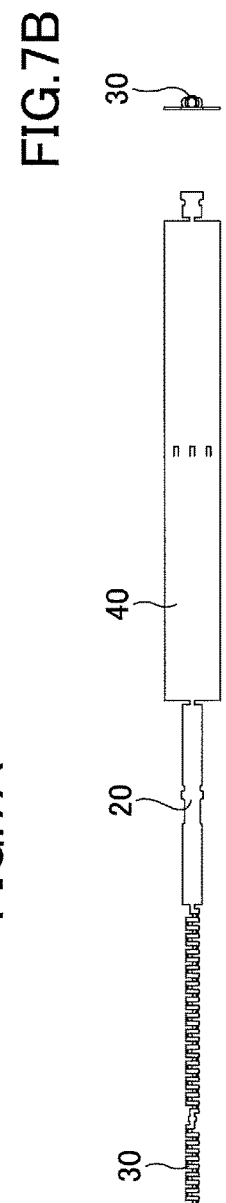

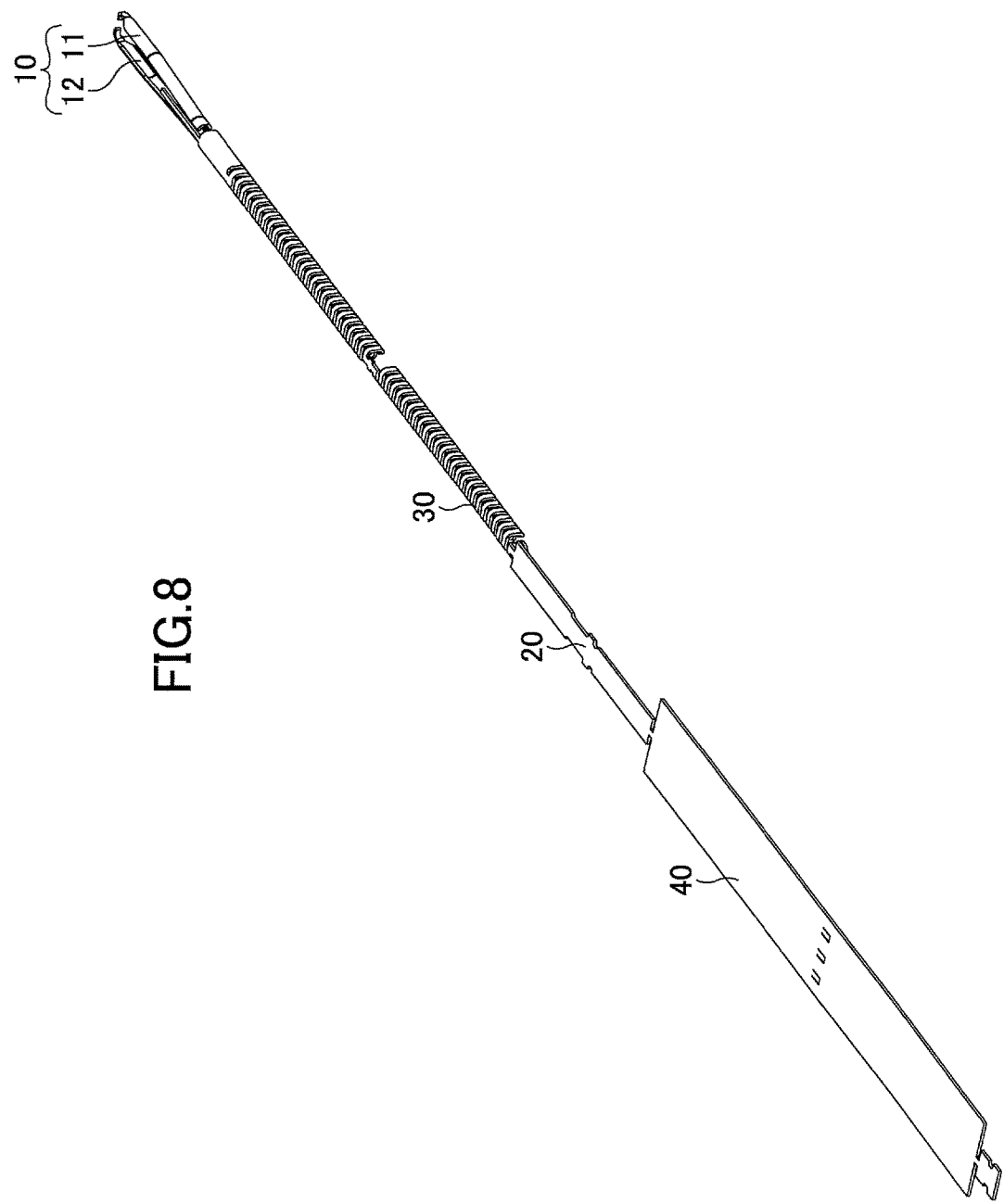

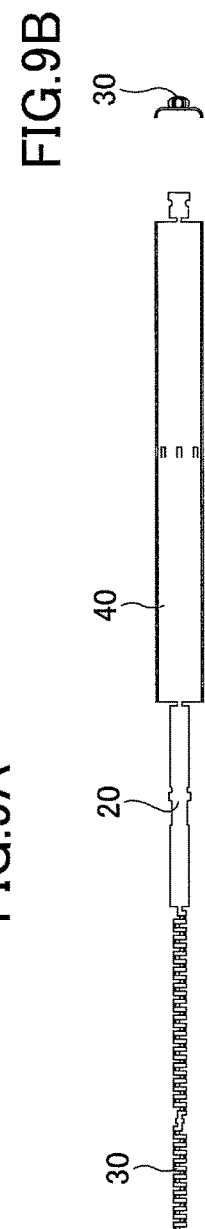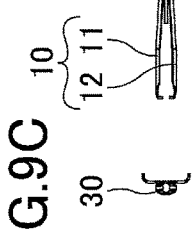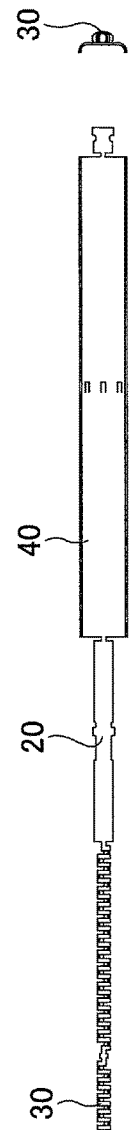

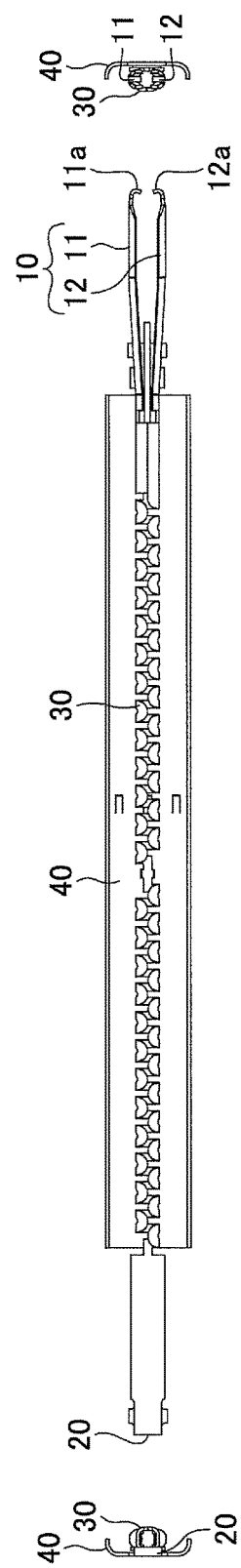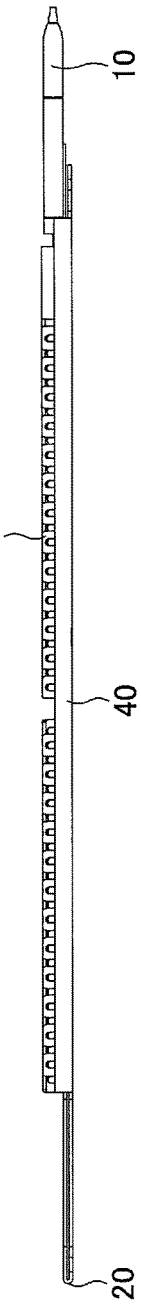

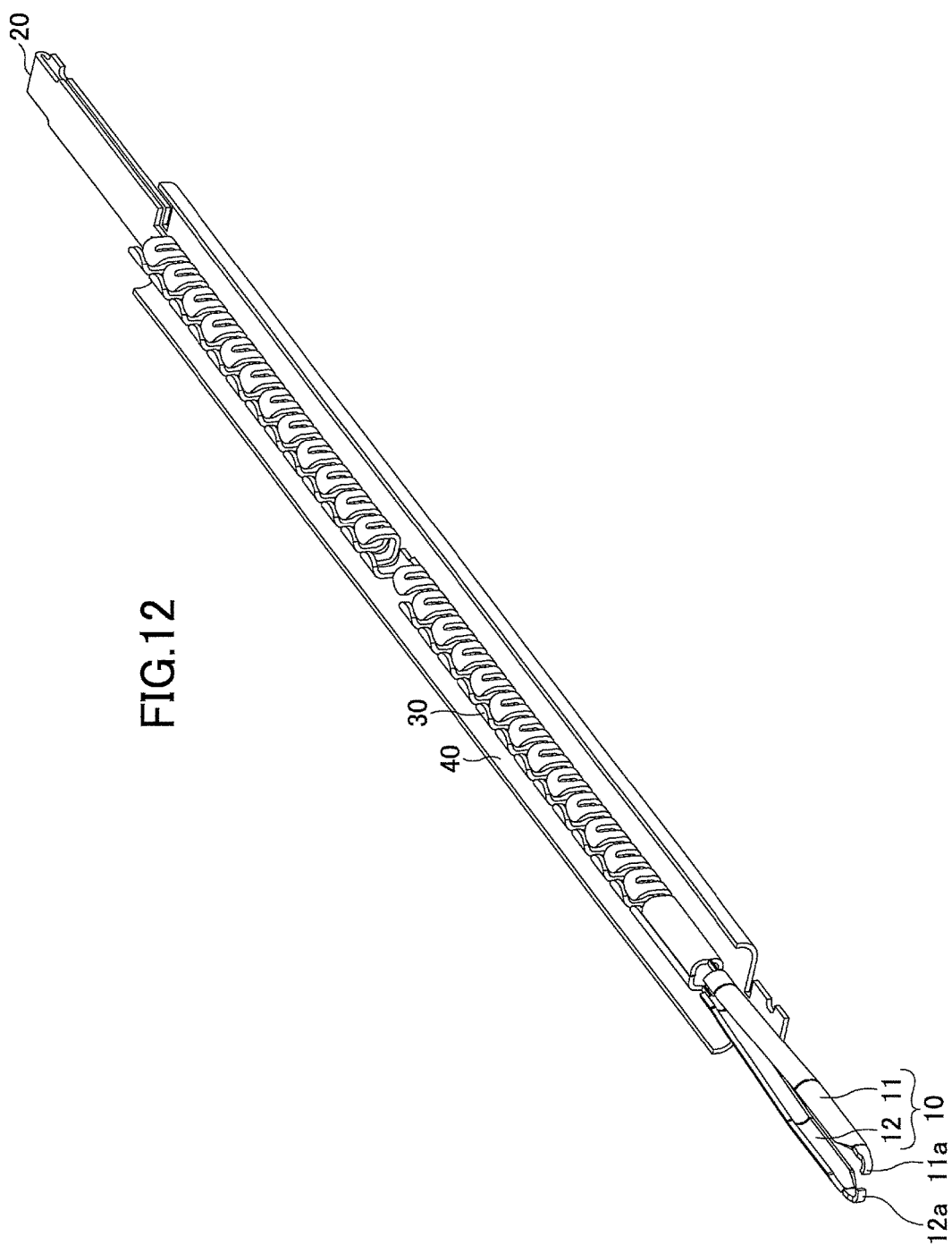

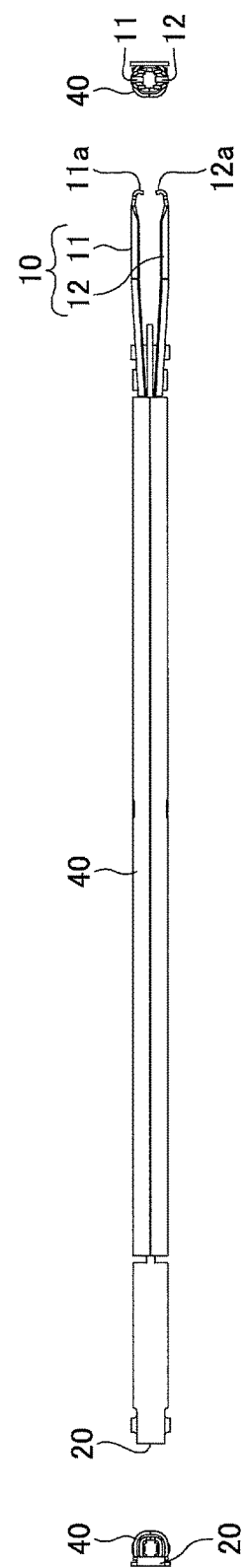
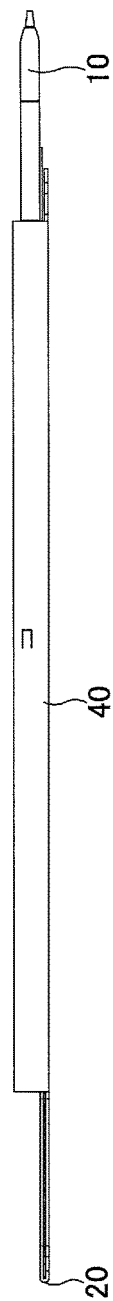
FIG.13A  FIG.13B  FIG.13C  FIG.13D

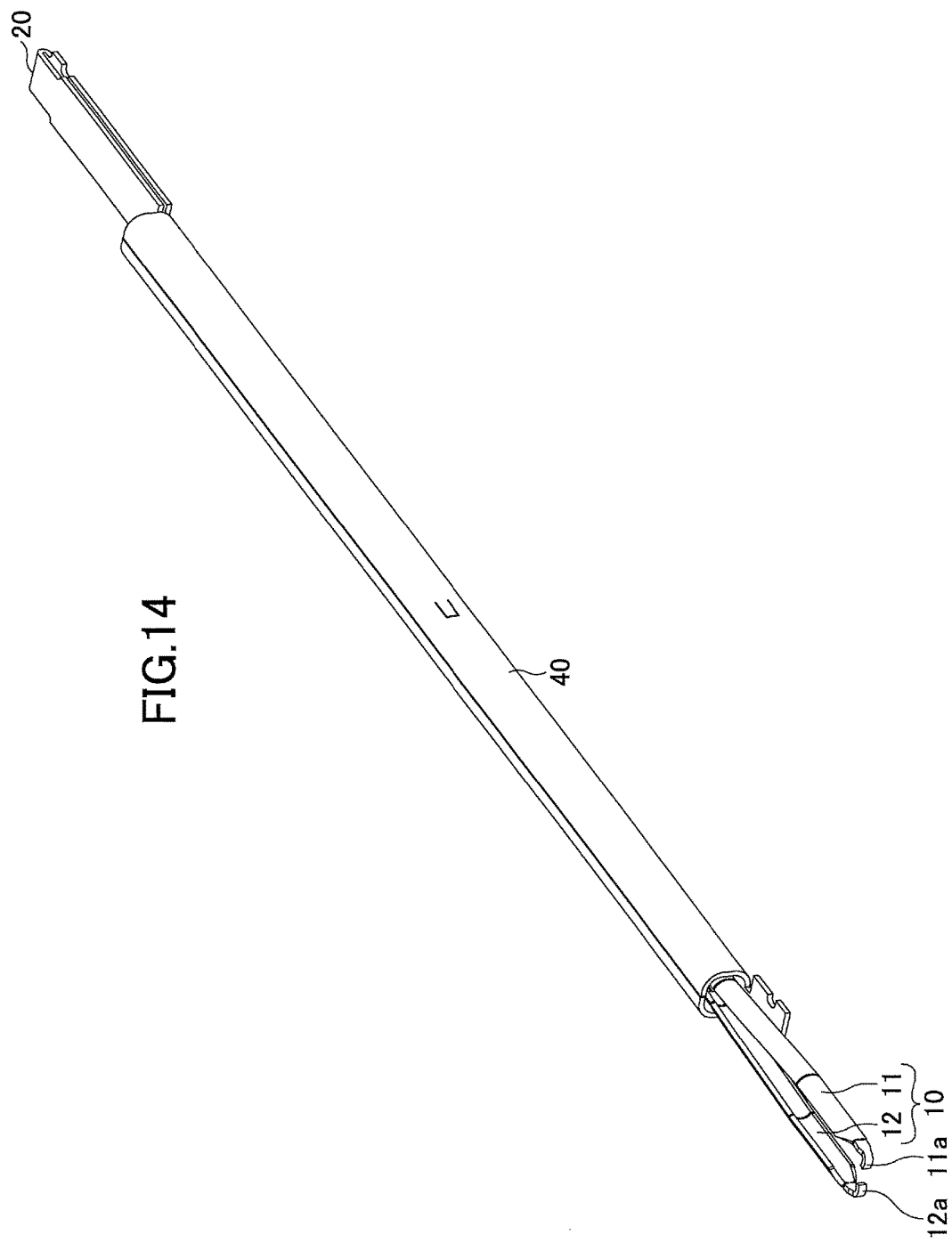

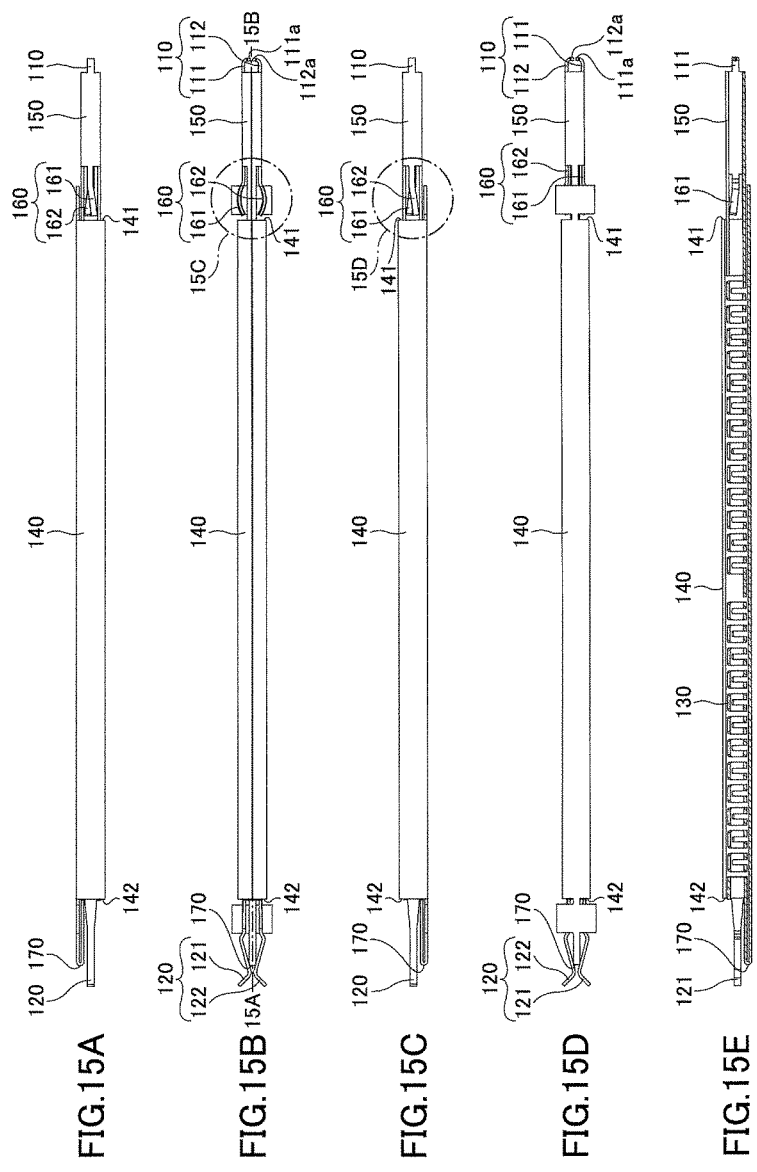

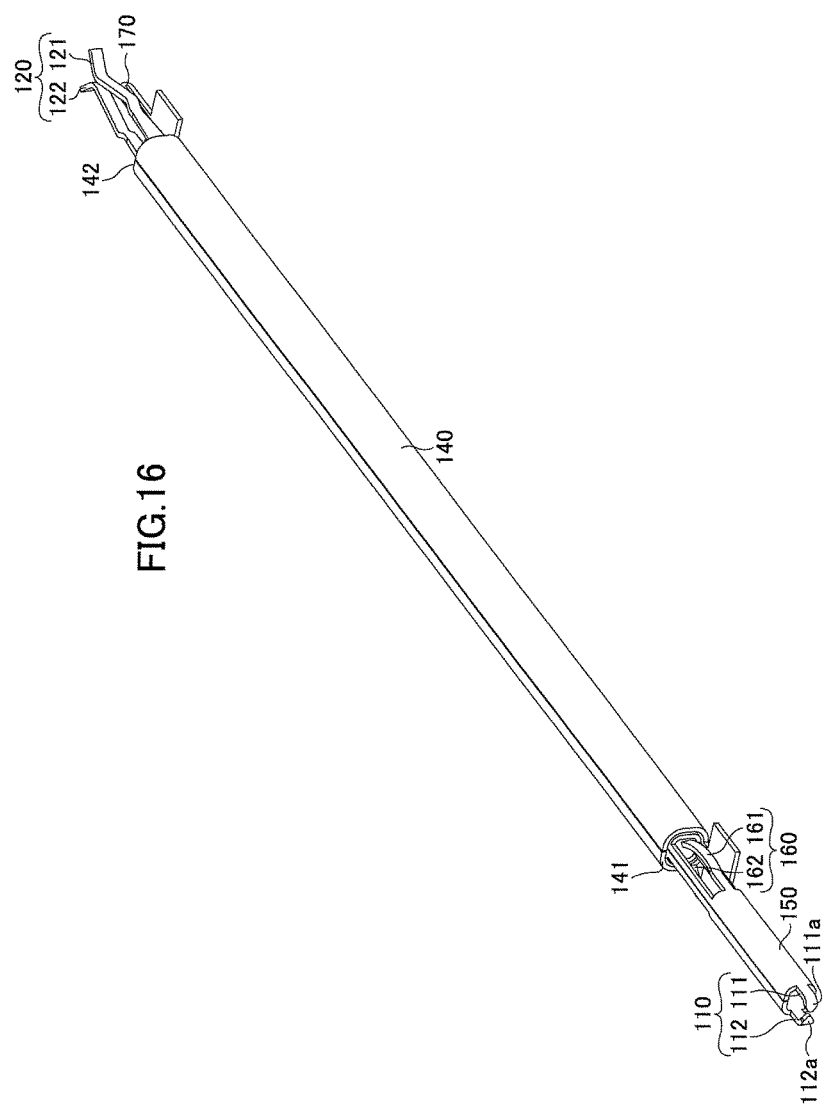

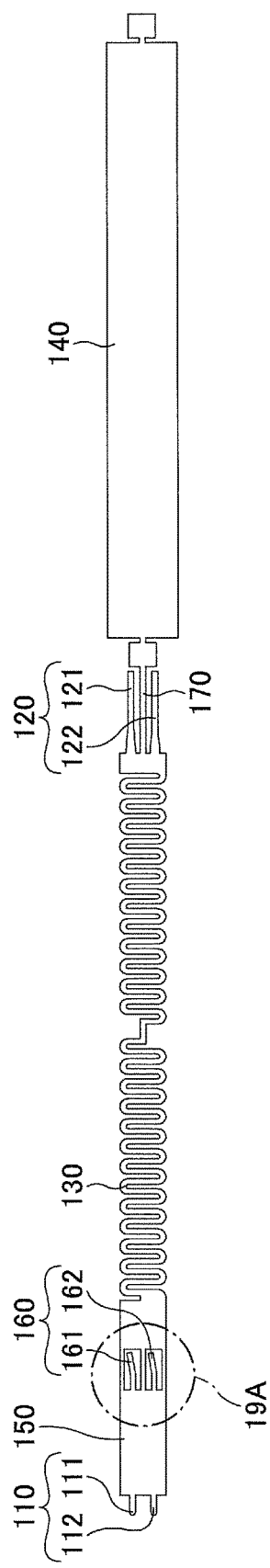

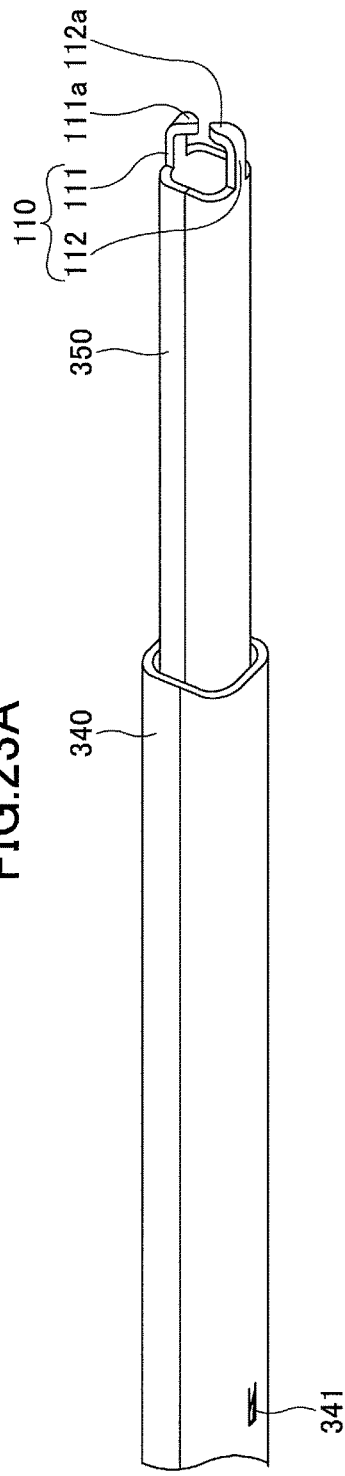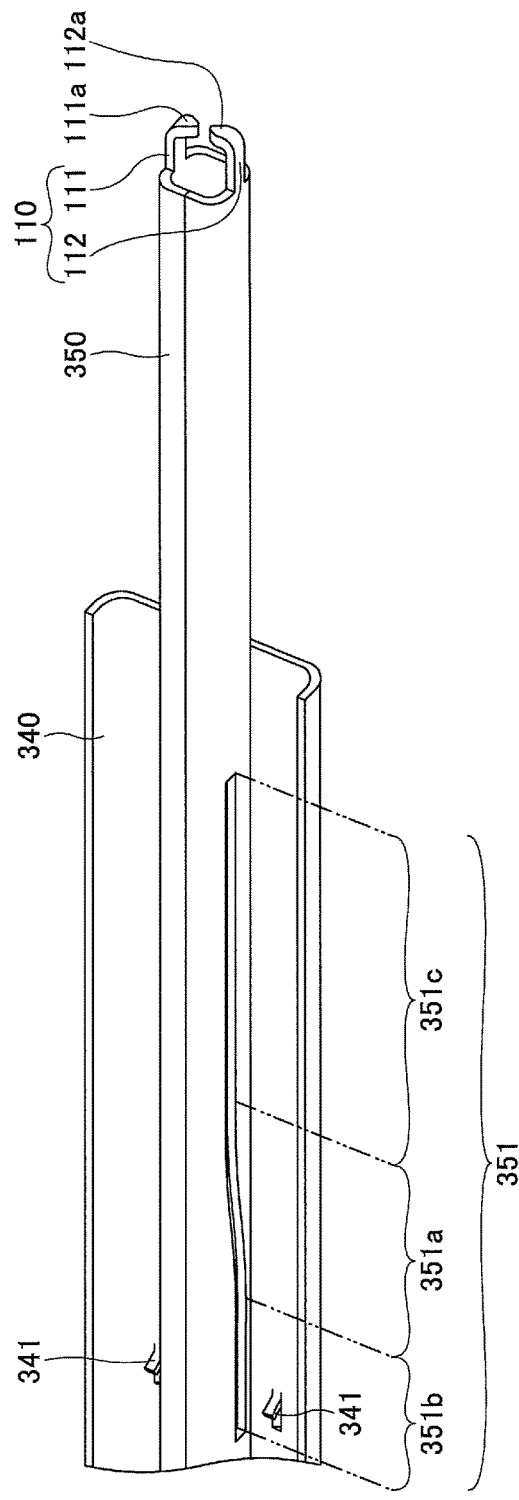

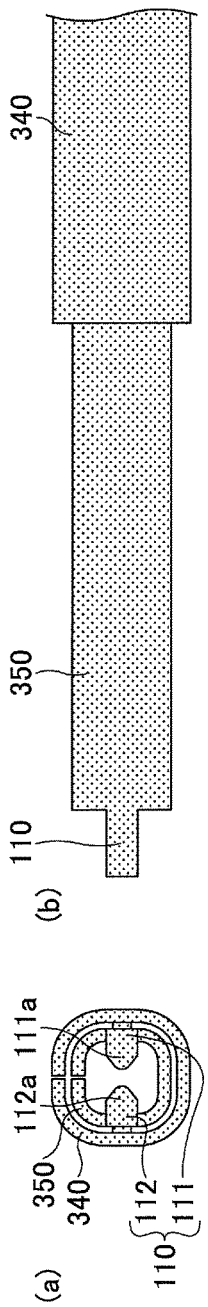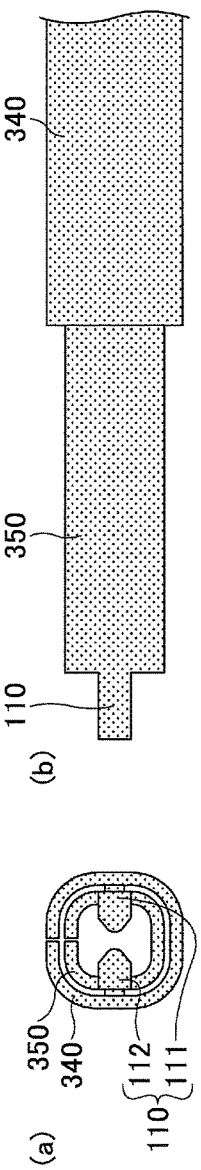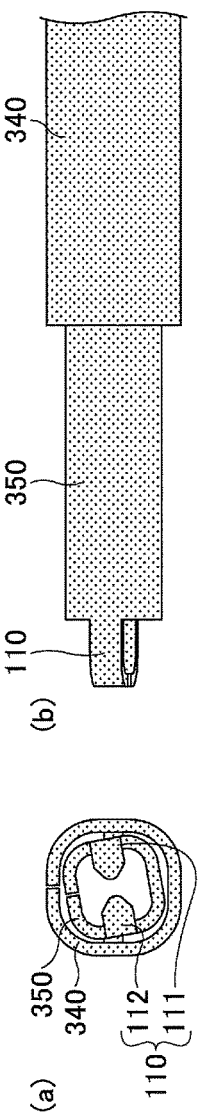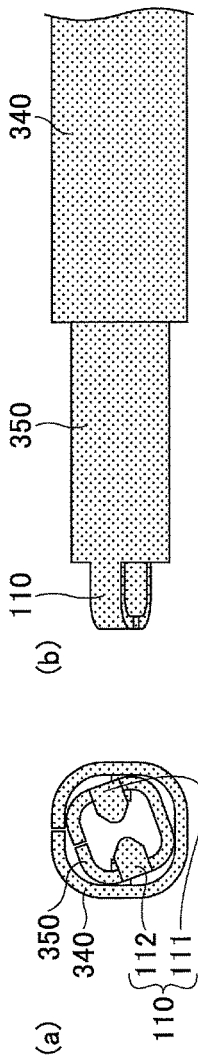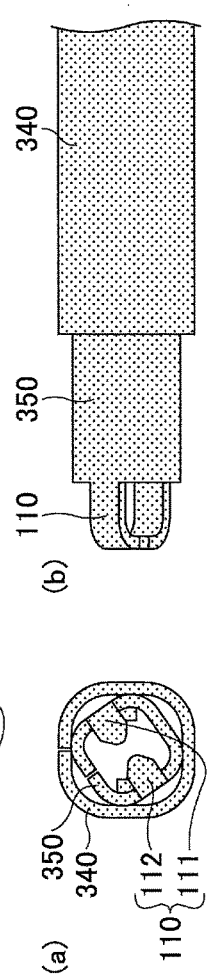
FIG.24A
FIG.24B
FIG.24C
FIG.24D
FIG.24E

CONTACT

CROSS-REFERENCE TO RELATED APPLICATIONS

This patent application is based upon and claims the benefit of priority of Japanese Patent Application No. 2015-133044 filed on Jul. 1, 2015, the entire contents of which are incorporated herein by reference.

BACKGROUND OF THE INVENTION

1. Field of the Invention

The present invention generally relates to a contact.

2. Description of the Related Art

A semiconductor device is manufactured by forming a semiconductor integrated circuit on a wafer made of, for example, silicon. When manufacturing a semiconductor device, a measuring apparatus is used to measure an electrical characteristic of a semiconductor integrated circuit. Such a measurement is performed in a state where a probe pin is electrically connected with an electrode pad of the semiconductor device.

A so-called coil spring probe is known as the contact (for example, Patent Document 1). The coil spring probe is formed by building a coil spring into a cylindrical casing. A terminal disposed at one end of the coil spring electrically contacts an electrode pad, and the other terminal disposed at the other end electrically contacts a measuring apparatus.

The coil spring probe expands or contracts by the coil spring provided inside a casing. The terminal is applied with force by a contact between the electrode pad and the terminal. Then, the contact contracts to secure an electrical contact between the electrode pad and the terminal.

However, manufacture of the coil spring probe requires outlay, time, and a high cost because the coil spring probe is manufactured by producing small parts such as a casing, a coil spring, and a terminal and assembling these parts.

Meanwhile, a contact manufactured by punching and bending a metal sheet is known (for example, Patent Document 2). The number of parts of the contact is as small as 1, and assembling of a large number of parts is not required. Therefore, the contact can be manufactured at a low cost.

[Patent Document 1] Japanese Laid-open Patent Publication No. 2007-24664

[Patent Document 2] Japanese Laid-open Patent Publication No. 2013-217800

[Patent Document 3] Japanese Laid-open Patent Publication No. 2009-128211

When an oxide film is formed on the surface of the electrode pad, it is not possible to accurately measure electrical characteristics of the semiconductor integrated circuit only with a contact between the electrode pad and the terminal. This is caused by no contact between the electrode pad and the contact due the oxide film.

Therefore, there is a method of scraping away the oxide film on the electrode pad using the front edge of the terminal to cause the electrode pad to contact the oxide film.

Here, the size of the electrode pad tends to decrease along with higher integration of the semiconductor device. The oxide film on the electrode pad is scraped when the edge of the terminal moves on the surface of the electrode pad. However, if the electrode pad is small, the front edge of the terminal may overrun to go off the electrode pad.

As such, when the contact terminal overruns to go off the electrode pad and the contact are separated, the electrical characteristics of the semiconductor integrated circuit cannot be measured.

SUMMARY OF THE INVENTION

According to an aspect of the present invention, there is provided a contact including a first terminal including a plurality of arms; a second terminal; a spring connecting the arms to the second terminal; and a casing covering the spring, wherein the arms outwardly protrude from one end of the casing, wherein an interval between the arms increases from a side of the casing to front edges of the arms, wherein when the arms are pushed toward the casing the arms are retracted into the casing and contact an inner side of the casing so that the interval between the arms decreases.

BRIEF DESCRIPTION OF THE DRAWINGS

FIGS. 1A to 1E illustrate a contact of the first embodiment;

FIGS. 5A to 5D illustrate a process chart of manufacturing the contact of the first embodiment;

FIG. 6 is a perspective view of a state illustrated in FIGS. 5A to 5D;

FIGS. 7A to 7D illustrate a process chart of manufacturing the contact of the first embodiment;

FIG. 8 is a perspective view of a state illustrated in FIGS. 7A to 7D;

FIGS. 9A to 9D illustrate a process chart of manufacturing the contact of the first embodiment;

FIGS. 11A to 11D illustrate a process chart of manufacturing the contact of the first embodiment;

FIG. 12 is a perspective view of a state illustrated in FIGS. 11A to 11D;

FIGS. 13A to 13D illustrate a process chart of manufacturing the contact of the first embodiment;

FIG. 14 is a perspective view of a state illustrated in FIGS. 13A to 13D;

FIGS. 15A to 15E illustrate the structure of a contact of a second embodiment;

FIG. 16 is a perspective view of the contact of the second embodiment;

FIG. 19 explains a manufacturing method of the contact of the second embodiment;

FIGS. 23A and 23B explain a contact of a fourth embodiment;

FIGS. 24A to 24E illustrate a contact process of the contact of the fourth embodiment.

DETAILED DESCRIPTION OF EMBODIMENTS

A description of embodiments of the present invention is given below, with reference to FIG. 1A through FIG. 25C. The embodiments described below are only examples and the present invention is not limited to the embodiments.

Through all figures illustrating the embodiments, the same references symbols are used for portions having the same function, and repetitive explanations of these portions are omitted.

First Embodiment (Contact)

Figure 2A:
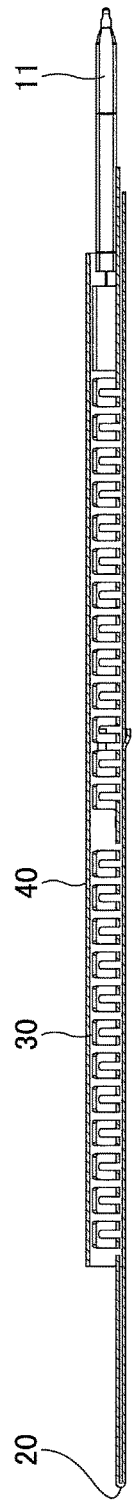
FIGS. 2A to 2D illustrate the contact of the first embodiment.
Figure 2B:
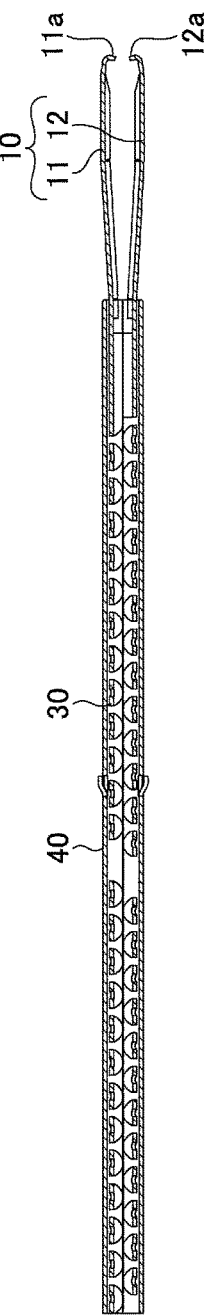
Figure 2C:
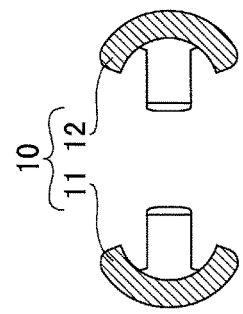

A contact of the first embodiment is described. The contact illustrated in FIGS. 1A to 2D of the first embodiment is called a probe pin and manufactured by processing a metal sheet. FIG. 1A is a plane view, FIG. 1B is a front view, FIG. 1C is a back view, FIG. 1D is a side view, and FIG. 1E is a bottom view of the contact of the first embodiment. FIG. 2A is a cross-sectional view obtained by cutting along a dot chain line 1A-1B of FIG. 1A. FIG. 2B is a cross-sectional view obtained by cutting along a dot chain line 1C-1D of FIG. 1D. FIG. 2C is an enlarged view of a part of FIG. 1A. FIG. 2C is a cross-sectional view obtained by cutting along a dot chain line 1E-1F of FIG. 1A.

In the contact of the first embodiment, an arm unit 10 functioning as a first terminal is formed at the one end, and a terminal 20 functioning as a second terminal is formed at the other end. A spring is formed between the arm unit 10 and the terminal 20. An area where the spring 30 is formed is covered by a casing 40 which is formed like a cylinder.

Figure 2D:
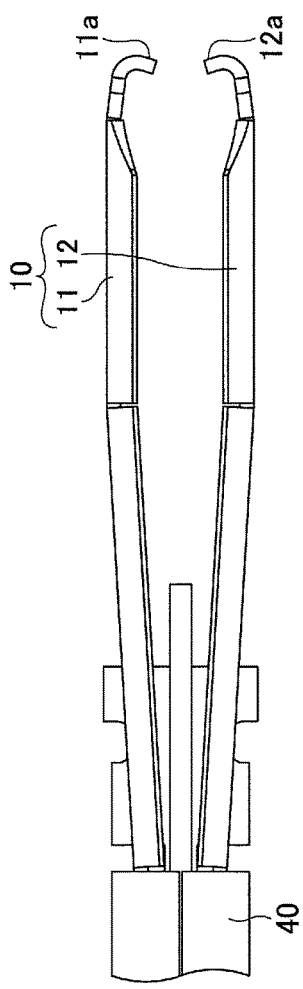

The arm unit 10 is formed of two arms 11 and 12. The front edges 11a and 12a of each of the two arms 11 and 12 are inwardly bent along directions to which the arms 11 and 12 face. The two arms 11 and 12 mutually separate more on the side of the front edges 11a and 12a than on the side of the casing 40 in a shape like V. As the contact is made of a metallic material, two arms have a spring property. Referring to FIG. 2D, the cross section of the arms 11 and 12 is shaped like U outwardly protruding so as to increase the strength of the arms.

FIG. 2C illustrates a state where the two arms protrude the most from the casing 40. In this state, the outside surfaces of the arms 11 and 12 do not contact the inside surface of the casing 40. When the arms 11 and 12 are pushed into the casing 40, the outside surfaces of the arms 11 and 12 contact the inside surface of the casing 40 to inwardly push the arms 11 and 12, and the interval between the arms 11 and 12 gradually reduces as the push-in amount increases.

Referring to FIGS. 3A to 4C, electrical connection of the contact with the electrode pad 50 are described below. The electrical connection between the contact and the electrode pad 50 is performed by pushing the arms 11 and 12 against the electrode pad 50.

Figure 3A:
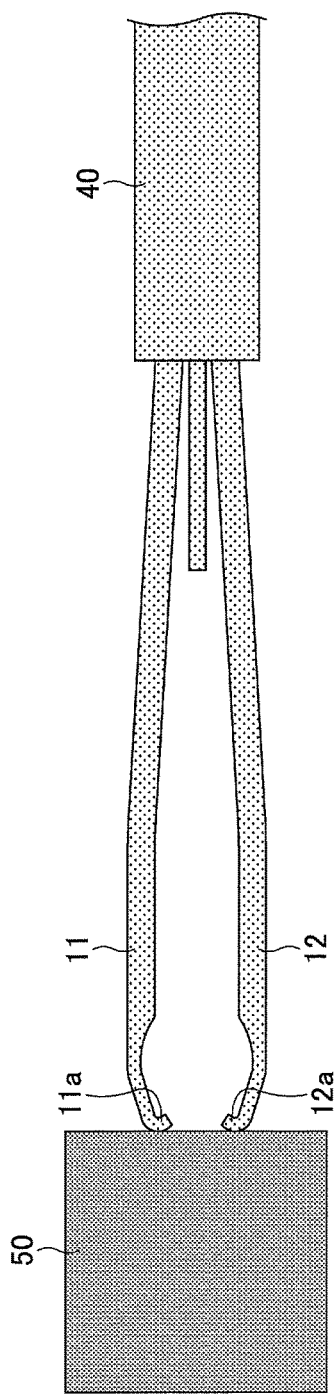
FIGS. 3A to 3C illustrate a contact process of the contact of the first embodiment.

At first, as illustrated in FIG. 3A, the front edges 11a and 12a of the arms 11 and 12 are caused to contact the electrode pad 50. In this state, the inner surface of the casing 40 does not contact the outside surfaces of the arms 11 and 12. If an oxide film is formed on the surface of the electrode pad 50, the electrode pad 50 is insulated by the oxide film and therefore there is probability that the electrode pad 50 may not electrically connected to the contact.

Figure 3B:
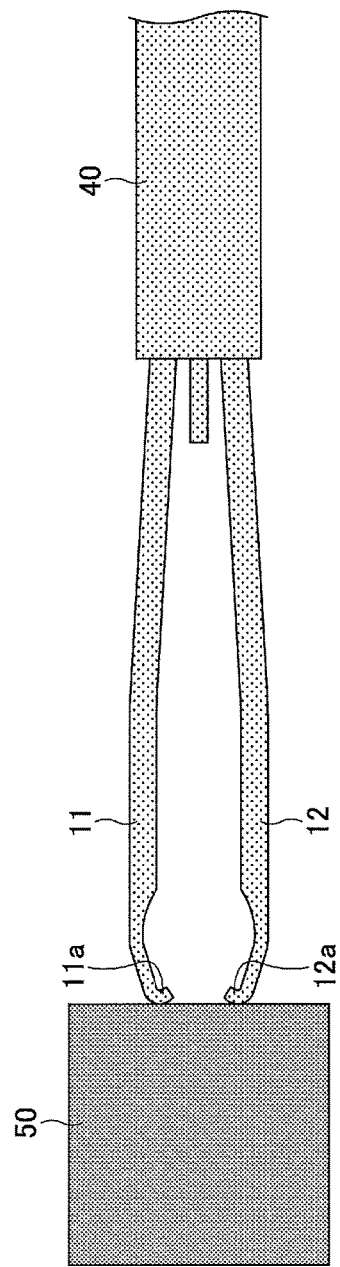

Next, as illustrated in FIG. 3B, the contact is pushed toward the electrode pad 50. With this, two arms 11 and 12 gradually enter into the casing 40. Similar to FIG. 3B, the casing 40 does not contact the arms 11 and 12, and therefore the front edges 11a and 12a do not inwardly move.

Figure 3C:
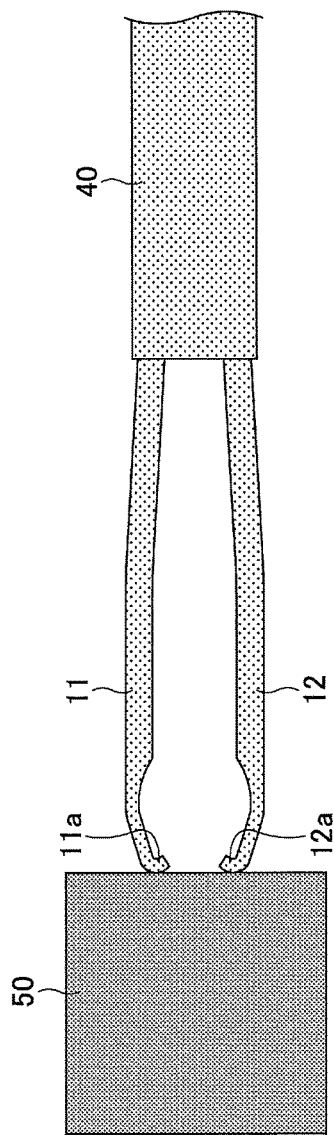

Next, as illustrated in FIG. 3C, the contact is further pushed toward the electrode pad 50. With this, the arms 11 and 12 further enter into the casing 40. In the state illustrated in FIG. 3C, the casing 40 contacts the arms 11 and 12. However, although the inside of the casing 40 starts to contact surfaces of the arms 11 and 12, the arms 11 and 12 are not pushed by the casing 40, and therefore the front edges 11a and 12a do not inwardly move. During the states illustrated in FIGS. 3A to 3C, the interval between the two front edges 11a and 12a does not change.

Figure 4A:
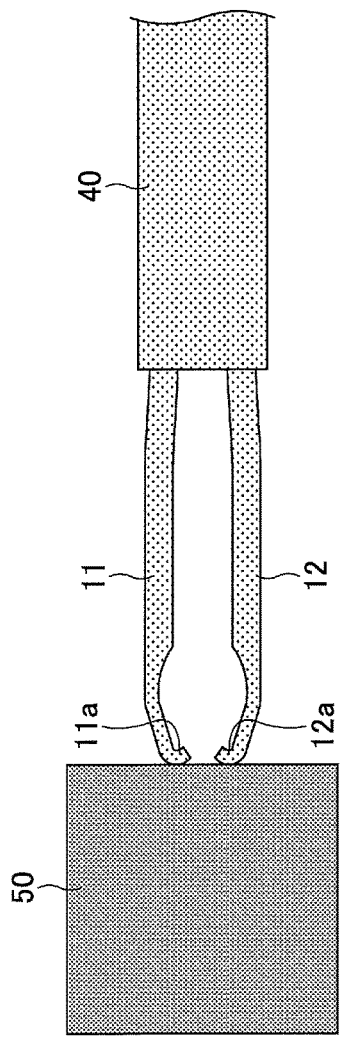
FIGS. 4A to 4C illustrate the contact process of the contact of the first embodiment.

Next, as illustrated in FIG. 4A, the contact is further pushed toward the electrode pad 50, and the arms 11 and 12 further enter into the casing 40 from the state illustrated in FIG. 3C. In FIG. 4A, as the outside surfaces of the arms 11 and 12 contact the inside of the casing 40, the arms 11 and 12 are inwardly pushed by the casing 40, and therefore the front edges 11a and 12a inwardly move on the surface of the electrode pad 50 in a direction of decreasing the interval between the front edges 11a and 12a. With this, the front edges 11a and 12a of the arms 11 and 12 abrade the surface of the electrode pad 50 so as to scrape off the oxide film on the electrode pad 50.

Figure 4B:
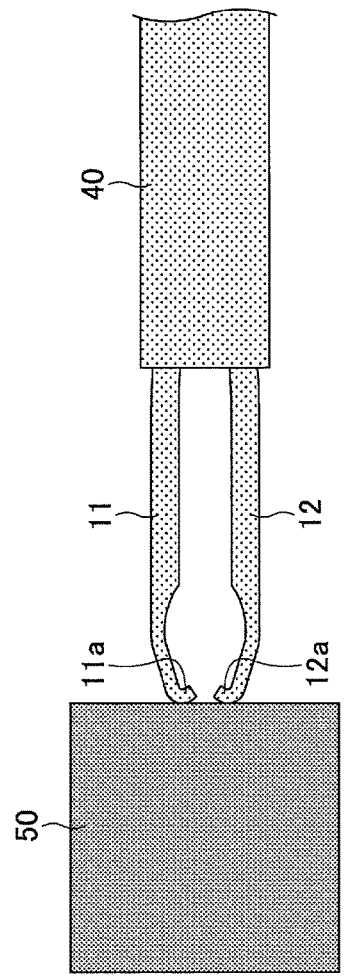

Next, as illustrated in FIG. 4B, the contact is further pushed toward the electrode pad 50, and the arms 11 and 12 further enter into the casing 40. Therefore, the arms 11 and 12 are further pushed by the casing 40 from the state illustrated in FIG. 4A, and the front edges 11a and 12b moves on the surface of the electrode pad 50 in the direction of further decreasing the interval. With this, the oxide film on the electrode pad 50 is further scraped away by the front edges 11a and 12a.

Figure 4C:
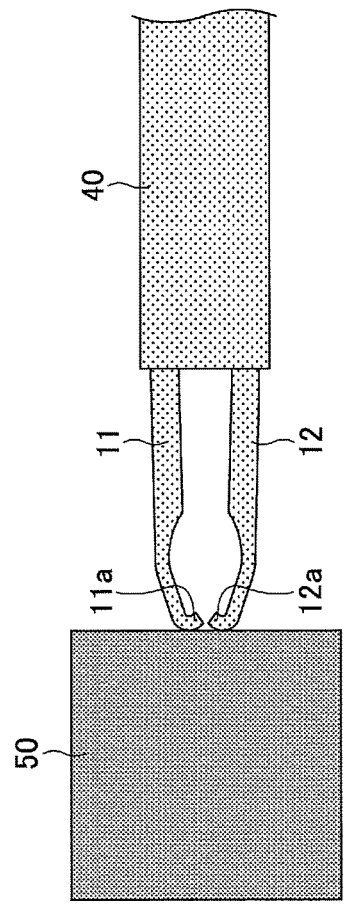

Next, as illustrated in FIG. 4C, the contact is further pushed, and the arms 11 and 12 further enter the casing 40. Therefore, the casing 40 contacting the arms 11 and 12 further pushes the arms 11 and 12, and the front edges 11a and 12a move on the surface of the electrode pad 50 in the direction of further decreasing the interval between the front edges 11a and 12a. With this, the oxide film on the surface of the electrode pad 50 is further scraped away by the front edges 11a and 12a. Portions where the oxide film on the electrode pad 50 is scraped contact the front edges 11a and 12a so as to electrically connect the electrode pad 50 with the contact.

In the state illustrated in FIG. 4C, the arms 11 and 12 contact the casing. Therefore, an electrical signal from the electrode pad 50 is transmitted through the front edges 11a and 12a, the two 11 and 12, and the casing 40 to the terminal 20. Because the cross-sectional area of the casing 40 is large, and the resistance and the inductance of the casing 30 are small, by propagating the electrical signal through the casing 40, electrical signal of high frequency can be transmitted.

In the first embodiment, by pushing the contact against the electrode pad 50, the front edges 11a and 12a moves in the direction of decreasing the interval between the front edges 11a and 12a.

In a contact in which the interval between two arms increase when the contact is pushed against an electrode pad, the interval between two spread front edges may exceed the size of the electrode pad depending on the size of the electrode pad. However, in the contact of the first embodiment, the arms 11 and 12 move in the direction to decrease the interval between the front edges 11a and 12a when the contact is pushed against the electrode pad 50. Therefore, even the size of the electrode pad 50 is small, the front edges 11a and 12a of the two arms 11 and 12 do not overrun to go off the electrode pad 50.

(Manufacturing Method)

Referring to FIG. 5A to 14, a method of manufacturing a contact of the first embodiment is described.

At first, referring to FIGS. 5A to 6, a metallic plate is punched to form a metal sheet including an area for forming an arm unit 10, a spring 30, a terminal 20, and a casing 40, which are sequentially connected. The metallic plate may undergo an etching process instead of the punching. FIG. 5A is a plan view, FIG. 5B is a front view, FIG. 5C is a back view, and FIG. 5D is a side view of the punched metal sheet. FIG. 6 is a perspective view of the punched metal sheet.

Next, referring to FIGS. 7A to 8, the arm unit 10 and the spring 30 are formed by bending both sides of the area of the metal sheet for forming an arm unit 10 and both sides of the area for forming the spring 30 about 90° along a longitudinal direction of the metal sheet. At this time, the arm 10 is bent so as to have a desired shape. FIG. 7A is a plan view, FIG. 7B is a front view, FIG. 7C is a back view, and FIG. 7D is a side view of the contact in which the arm unit and the spring are formed. FIG. 8 is a perspective view of the contact in which the arm unit and the spring are formed.

Figure 10:
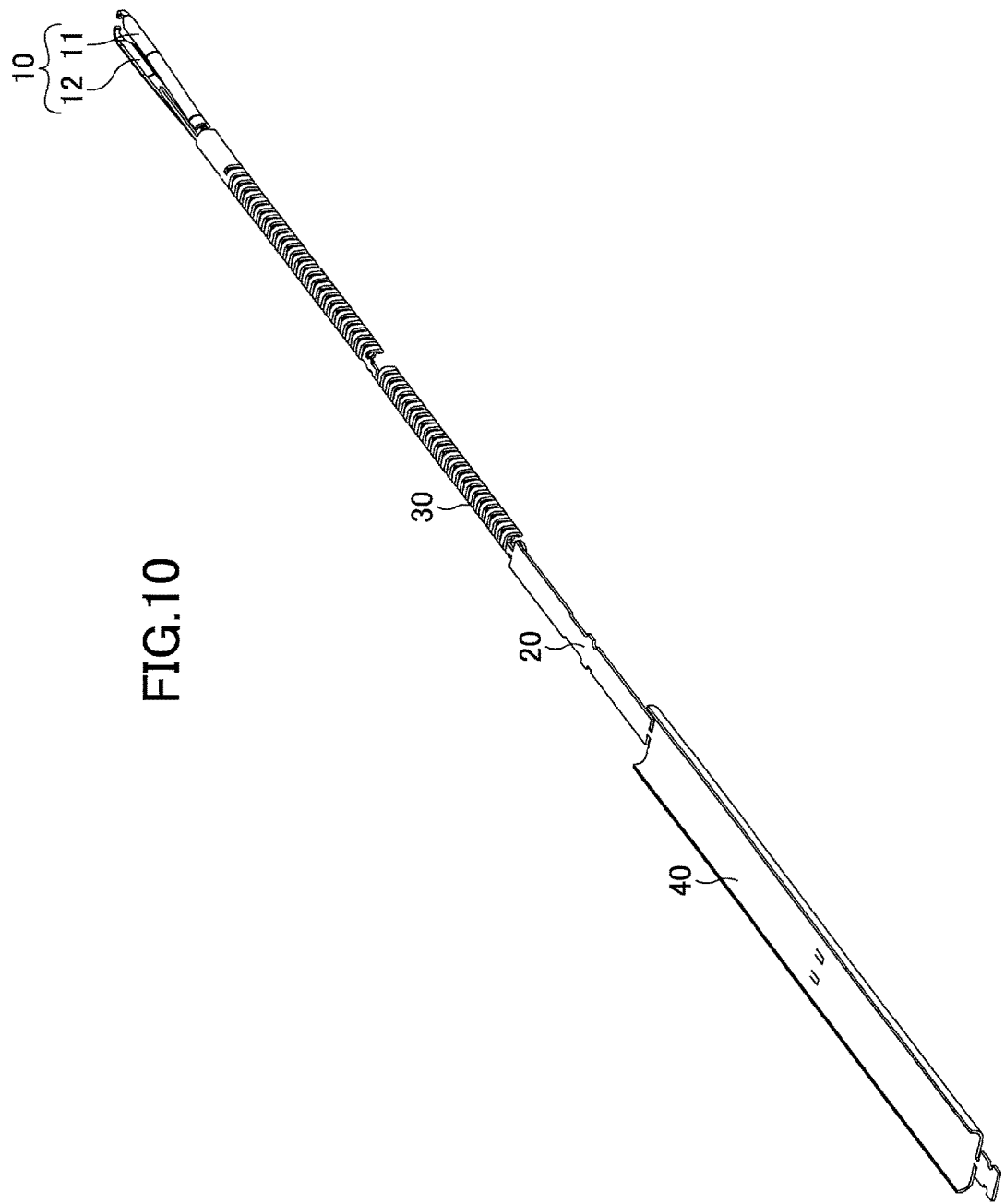
FIG. 10 is a perspective view of a state illustrated in FIGS. 9A to 9D.

Next, referring to FIGS. 9A to 10, the area of the metal sheet for forming the casing 40 is bent at vicinities of both side edges about 90° along the longitudinal direction of the metal sheet. At this time, the area of the metal sheet is bent in a direction opposite to the direction of bending the arm unit 10 and the spring 30. FIG. 9A is a plan view, FIG. 9B is a front view, FIG. 9C is a back view, and FIG. 9D is a side view of the metal sheet in this state. FIG. 10 is a perspective view of the metal sheet in this state.

Next, referring to FIGS. 11A to 12, the area of the metal sheet for forming the terminal 20 is bent about 180° along the transverse direction orthogonal to the longitudinal direction of the metallic plate. At this time, the metal sheet is bent so that the spring 30 can be covered by the casing 40 in a later process. FIG. 11A is a plan view, FIG. 11B is a front view, FIG. 11C is a back view, and FIG. 11D is a side view of the metal sheet in this state. FIG. 12 is a perspective view of the metal sheet in this state.

Next, referring to FIGS. 13A and 14, both sides of the area for forming the casing between the portions bent in FIGS. 11A to 12 are bent about 90° along the longitudinal direction of the metal sheet to form the casing 40. With this, the contact of the first embodiment is formed. FIG. 13A is a plan view, FIG. 13B is a front view, FIG. 13C is a back view, and FIG. 13D is a side view of the contact in this state. FIG. 14 is a perspective view of the contact in this state.

Second Embodiment

Figure 17A:
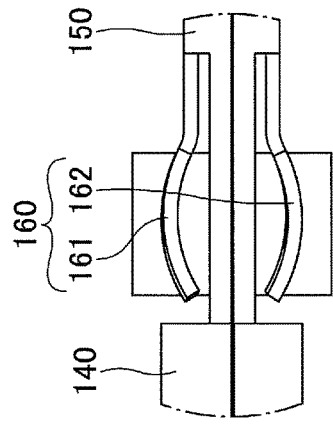
FIGS. 17A to 17D explain the contact of the second embodiment.
Figure 17C:
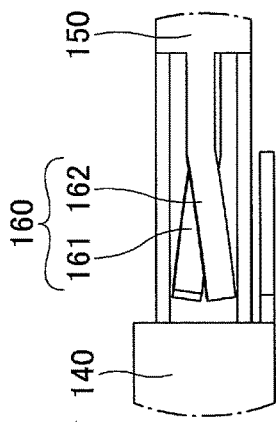
Figure 17B:
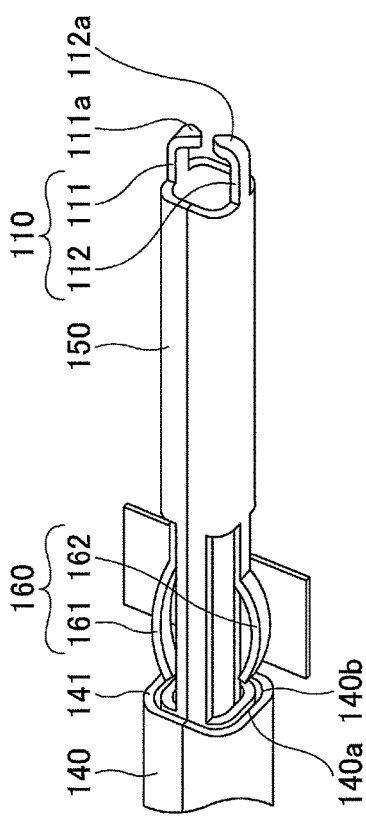
Figure 17D:
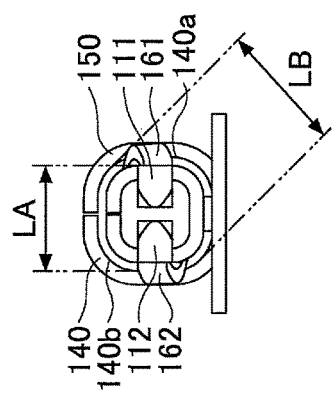

A contact of a second embodiment is described. A contact illustrated in FIGS. 15A to 17D can be manufactured by punching and bending a metal sheet in a manner similar to the first embodiment. FIG. 15A is a right side view, FIG. 15B is a plan view, FIG. 15C is a left side view, FIG. 15D is a bottom view of a contact according to the second embodiment, and FIG. 15E is a cross-sectional view of the contact taken along a dot chain line 15A-15B illustrated in FIG. 15B. FIG. 16 is a perspective view of the contact of the second embodiment. FIG. 17A is front view of the contact of the second embodiment. FIG. 17B is an enlarged view of a part of the contact. FIG. 17C is an enlarged view of a part of the contact surrounded by a circle of a dot chain line 15C in FIG. 15B. FIG. 17D is an enlarged view of a part of the contact surrounded by a circle of a dot chain line 15D in FIG. 15C.

In the contact of the second embodiment, a first terminal 110 is formed on its one end, and a second terminal 120 is formed on the other end. A spring 130 is formed between the first terminal 110 and the second terminal 120. An area where the spring 130 is formed is covered by a casing 140.

The first terminal 110 is positioned at the front edge of a plunger 150 and includes two terminals 111 and 112. In the contact of the first embodiment, the plunger 150 and a cantilever 160 are sequentially formed in a direction from the first terminal 110 to the casing 140 between the first terminal 110 and the casing 140. The cantilever 160 is connected to the spring 130 disposed inside the casing 140. In a state where force is not applied to the first terminal 110 and the second terminal 120, the first terminal 110, the plunger 150, and the cantilever 160 are exposed outside from one end 141 of the casing 140. The second terminal 120 includes two terminals 121 and 122 and is exposed outside from the other end 142 of the casing 140.

Referring to FIGS. 17A and 17B, the casing 140 is formed by bending a metal sheet in a longitudinal direction, and the cross-sectional shape of the casing 140 is substantially a square. The casing 140 includes, in its inside, flat portions 140a corresponding to sides of the square and curved portions 140b corresponding to corners of the square in its cross-sectional shape.

The contact includes two cantilevers 161 and 162 which have a log and thin shape. Hereinafter, the cantilevers 161 and 162 are collectively referred to as a cantilever 160. Referring to FIGS. 17C and 17D, the cantilever 160 is formed substantially in parallel to the longitudinal direction of the casing 140 in the vicinity of the plunger 150. On the other hand, a portion of the cantilever 160 on the side of the casing 140 is provided at a position correspond to the curved face portions 140b, which are at positions corresponding to corners inside the casing 140. The cantilever 160 has a shape twisted from the side of the plunger 150 to the casing 140. Said differently, the cantilever 160 has a shape angled relative to the longitudinal direction of the casing 140. Referring to FIG. 17D, the cantilever 160 has a shape in which the cantilever 160 is obliquely bent in the vicinity of its center. Referring to FIG. 17C, the cantilever 160 has an arc-like shape in which the width of the cantilever 160 is maximum at the vicinity of its center. At the end portion of the cantilever 160 on the side of the plunger 150, the distance between the cantilevers 161 and 162 is substantially the same as the width of the plunger 150.

Within the embodiments, an interval LA is a interval in the inside of the casing 140 between the facing flat portions 140a, an interval LB is an interval between the facing curved portions 140b.

The distance between the outer sides of two cantilevers 161 and 162 at its center and the vicinity of its center, is formed to be greater than the interval LB. The distance between the outer sides of two cantilevers 161 and 162 increases as the distance from the first terminal 110 increases, becomes the maximum at the center of the cantilevers 160, and gradually decreases as the distance from the first terminal 110 further increases.

Because the two cantilevers 161 and 162 are formed of the metal, the cantilevers 161 and 162 have elasticity.

Although the cross-sectional shape of the casing 140 is substantially a square has been described above, the cross-sectional shape may be another polygonal shape. The cross-sectional shape of the casing 140 may be a shape having a greater width and a smaller width inside the casing 140. This shape may be an ellipse or the like.

Referring to FIGS. 18A to 18D, processes of electrically connecting the contact with the electrode pad in the second embodiment are described below. The electrode pad is omitted from illustration in FIGS. 18A to 18D and hereafter. An electrical connection between the contact and the electrode pad is caused by pressing contact terminals 111 and 112 against the electrode pad. Referring to FIGS. 18A to 18D, the left views (a) are front views and the right views (b) are side views.

At first, the front edges 111a and 112a of the contact terminals 111 and 112 are caused to contact the electrode pad and be slightly pushed toward the electrode pad. In this state, the casing 140 starts to contact the outside of the cantilever portion 160. At first, the vicinities of the end portions of the cantilevers 161 and 162 far from the terminal 110 contacts the inside of the casing 140. The cantilevers 161 and 162 are formed in a twisted shape, and the portions of the cantilevers 161 and 162 far from the terminal 110 is provided at a position correspond to the position of the casing 140 with the greater width, namely, the position of the curved portion 140b. Therefore, even when the outsides of the cantilevers 161 and 162 contact the portion of the casing 140 with the greater width, areas of the cantilevers 161 and 162 contacting the casing 140 do not move, and therefore, the plunger 150 does not rotate, and the front edges 111a and 112a of the contact terminals 111 and 112 do not move.

Figure 18A:
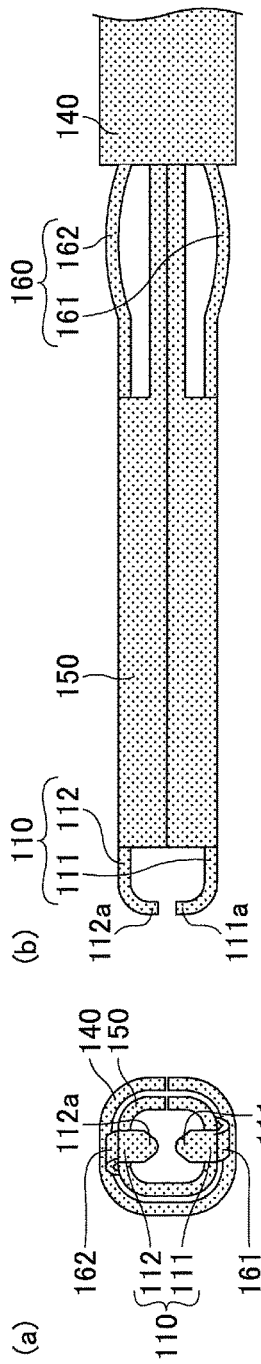
FIGS. 18A to 18D illustrate a contact process of the contact of the second embodiment.
Figure 18B:
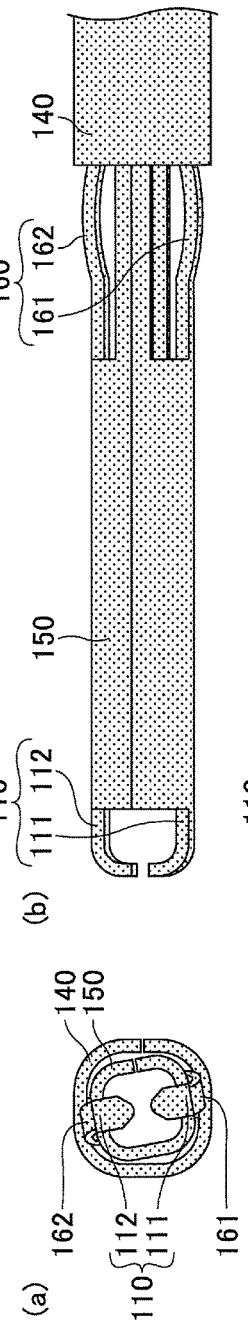

Next, as illustrated in FIG. 18B, the contact is further pushed toward the electrode pad 50, and the cantilever 160 is inserted inside the casing 140 formed in a cylindrical shape. At this time, the cantilever 160 is inserted inside the casing 140 while the outer surface of the cantilever 160 contacts the inside of the casing 140. At this time, the cantilever 160 is inserted inside the casing 140 in a state where the cantilevers 161 and 162 contact a portion of the casing with the greater width, which are the curved portions 140b. As the distance between the cantilever 161 and the cantilever 162 at its center is greater than the interval LB, and the cantilever 161 and the cantilever 162 have an elasticity, the cantilever 161 and the cantilever 162 are bent in a direction of mutually approaching as the cantilever 160 is further inserted inside the casing 140. With this, areas of the cantilevers 161 and 162 contacting the casing approach the terminal 110. Because the cantilevers 161 and 162 are formed to be twisted, the plunger 150 is rotated when areas of the cantilevers 161 and 162 contacting the casing 140 approach the terminal 110. With this, the front edges 111a and 112a slide on the surface of the electrode pad while rotating to scrape off the oxide film on the surface of the electrode pad.

Referring to FIG. 17A, the interval LB between the facing curved portions 140b is greater than the interval LA between the facing flat portions 140a. Therefore, when the cantilever 160 intrudes inside the casing 140, the outer surfaces of the cantilever 160 contact the curved portions 140b because the interval LB is greater than the interval LA.

Figure 18C:
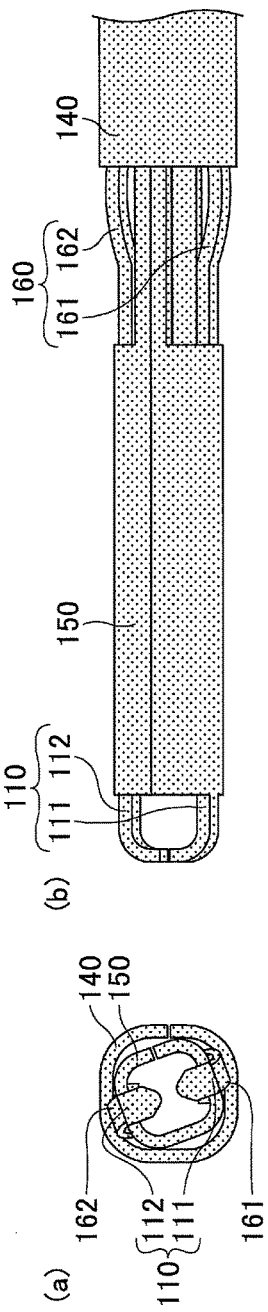

Next, as illustrated in FIG. 18C, the contact is further pushed, and the cantilever 160 further enters into the casing 140. At this time, the cantilever 160 enters into the casing 140 while the outer faces of the cantilever 160 contacting the curved portions 140b. Therefore, as areas of the cantilevers 161 and 162 contacting the curved portions 140b approach the terminal 110, the plunger 50 rotates, and the front edges 111a and 112a slide on the surface of the electrode pad while the front edges 111a and 112a rotate. With this, the oxide film on the surface of the electrode pad is further scraped.

Figure 18D:
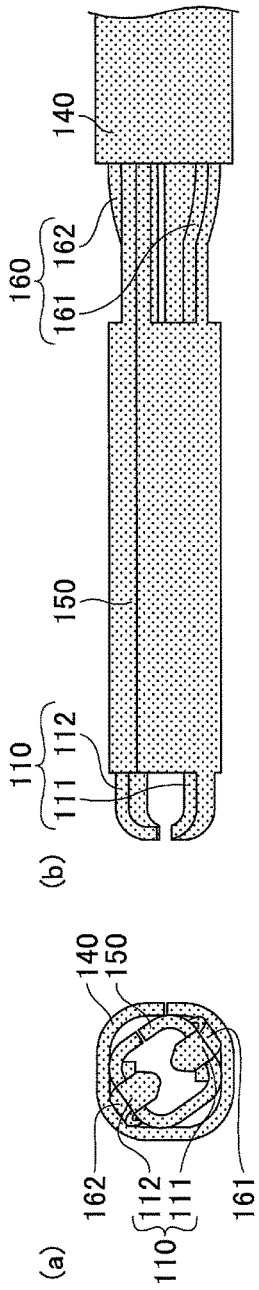

Next, as illustrated in FIG. 18D, the contact is further pushed, and the cantilever 160 further enters into the casing 140. At this time, as the cantilever 160 enters into the casing 140 while the outer faces of the cantilever 160 contact the curved portions 140b, and areas of the cantilevers 161 and 162 contacting the curved portions 140b further approach the terminal 110, the plunger 50 rotates and the front edges 111a and 112a further slide on the surface of the electrode pad while the front edges 111a and 112a rotate. With this, the oxide film on the surface of the electrode pad is scraped so as to cause a metallic portion of the electrode pad to be exposed outside. Therefore, the electrode pad contacts the front edges 111a and 112a so as to electrically connect the electrode pad to the contact of the second embodiment.

In this state, the outer faces of the cantilever 160 contact the curved portions 140b inside the casing 140. Therefore, the electrical signal from the electrode pad is transmitted from the front edges 111a and 112a through the terminals 111 and 112, the plunger 150, the cantilever 160, and the casing 140 to the second terminal 20.

The front edges 111a and 112a of the second embodiment slide on the front surface of the electrode pad while rotating on the front surface of the electrode pad. Therefore, the interval between two front edges 111a and 112a does not change even if the contact is pushed against the electrode pad. Therefore, even if the electrode pad is small, the terminals 111 and 112 do not deviate outwardly from the electrode pad.

(Manufacturing Method)

Figure 20A:
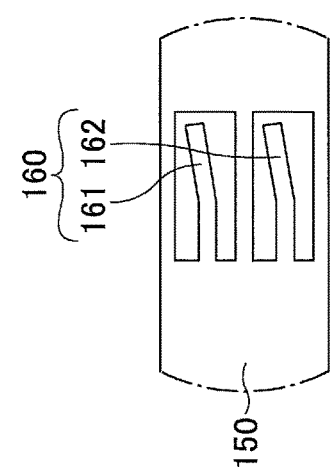
FIGS. 20A and 20B explain the manufacturing method of the contact of the second embodiment.
Figure 20B:
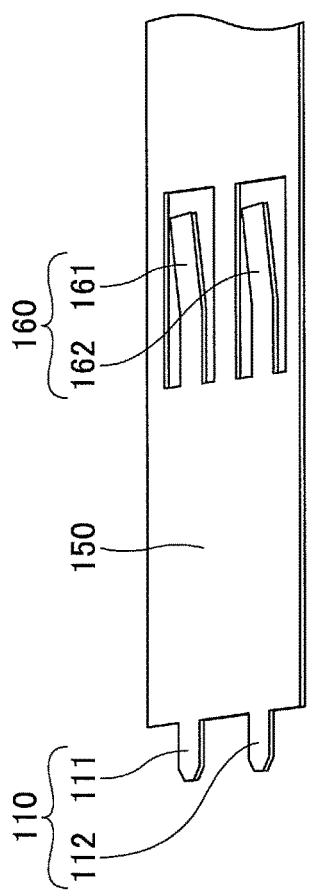

Referring to FIGS. 19 to 20B, a method of manufacturing the contact of the second embodiment is described. FIG. 20A is an enlarged view of an area of FIG. 19 surrounded by a dot chain line 19A. FIG. 20B is a perspective view of a part of a metallic plate illustrated in FIG. 19.

At first, as illustrated in FIG. 19, a metal sheet is formed so as to include an area for forming the first terminal 110, an area for forming the plunger 150, an area for forming the cantilever 160, an area for forming the spring 130, an area for forming the second terminal 120, and an area for forming the casing 140, which are sequentially connected.

Next, by bending the metal sheet at both sides of each on the area for forming the first terminal 110, the area for forming the plunger 150, the area for forming the cantilever 160, the area for forming the second terminal 120, and the area for forming the spring 130 about 90° along the longitudinal direction of the metal sheet, the first terminal 110, the plunger 150, the cantilever 160, the second terminal 120, and the spring 130 are formed. Thereafter, the plunger 150 is formed by further bending the outer sides of the area of the metal sheet for forming the plunger 150 by 90°. In the area for forming the cantilever 160, an area forming the cantilevers 161 and 162 is formed so as to extend in a direction slanted relative to the longitudinal direction of the plunger 150. Accordingly, when the cantilever 160 is formed, the outsides of the cantilever 160 are bent in an arc-like shape so as to contact the insides of the casing 140.

Next the vicinities of both edges of the area of the metal sheet for forming the casing 140 are bent about 90° in the direction opposite to the direction of bending the spring 130 along the longitudinal direction.

Next, a fold portion 170 of the metal sheet is folded 180° along a direction orthogonal to the longitudinal direction. In a latter process, the fold portion 170 is folded in a direction enabling the casing 140 to cover the spring 130.

Next, the casing 140 is formed so as to cover the spring 130 by bending both sides of a portion inside the vicinities of the folded edge about 90° along the longitudinal direction. Thereafter, the contact is manufactured by bending the terminals 111 and 112 of the first terminal 111 and the terminals 121 and 122 of the'second terminal 120 to have desired shapes.

Third Embodiment

Figure 21A:
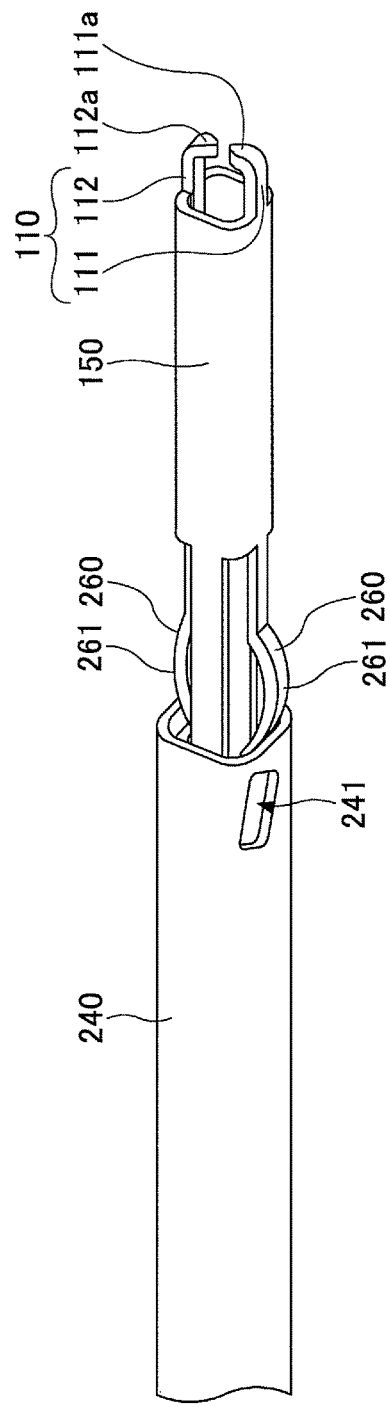
FIGS. 21A and 21B explain a contact of a third embodiment.
Figure 21B:
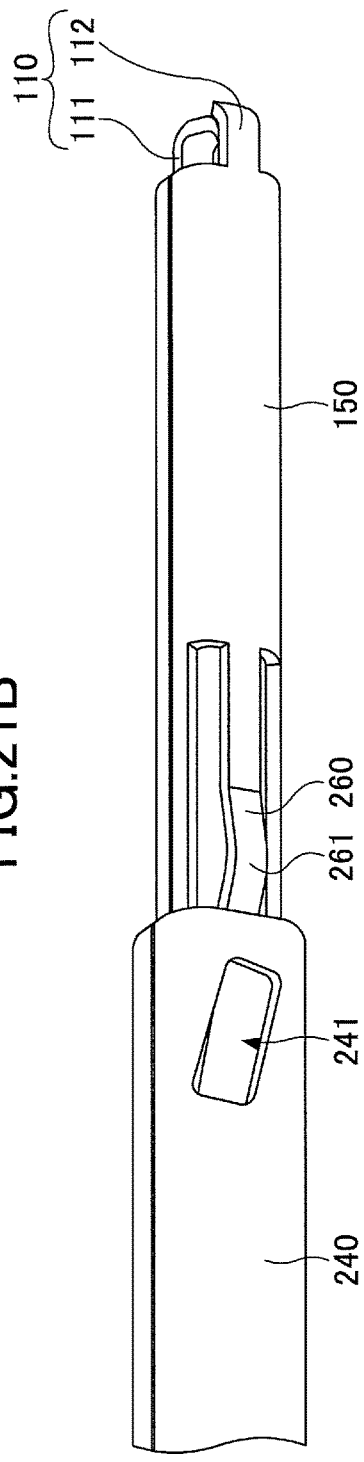

A contact of a third embodiment is described. Referring to FIGS. 21A and 21B, the contact of the third embodiment included a cantilever 260 and an opening 241 formed in a casing 240.

In the contact of the third embodiment, two cantilevers having a shape along the longitudinal direction of the casing 240 are formed. Protrusions 261 are formed respectively in the middle parts of the two cantilevers so as to outwardly protrude. Hereinafter, the two cantilevers are collectively referred to as a "cantilever 260". The opening 241 is formed so as to have a shape slanted relative to the longitudinal direction of the casing 240. In the contact of the third embodiment, the protrusion 261 of the cantilever 260 enters into the opening 241 and the cantilever 260 is guided by the slanted opening 241 so that the terminals 111 and 112 of the first terminal 110 and the plunger 150 rotate.

Referring to FIGS. 22A to 22D, processes of electrically connecting the contact with an electrode pad in the third embodiment are described below. An electrical connection between the contact and the electrode pad is caused by pressing front edges 111*a* and 112*a* of contact terminals 111 and 112 against the electrode pad. Referring to FIGS. 22A to 22D, (a) is a cross-sectional view of the contact, (b) is a front view of the contact, and (c) is a side view of a part of the contact. The cross-sectional view (a) is taken along a dot chain line 22A-22B in the side view (c).

Figure 22A:
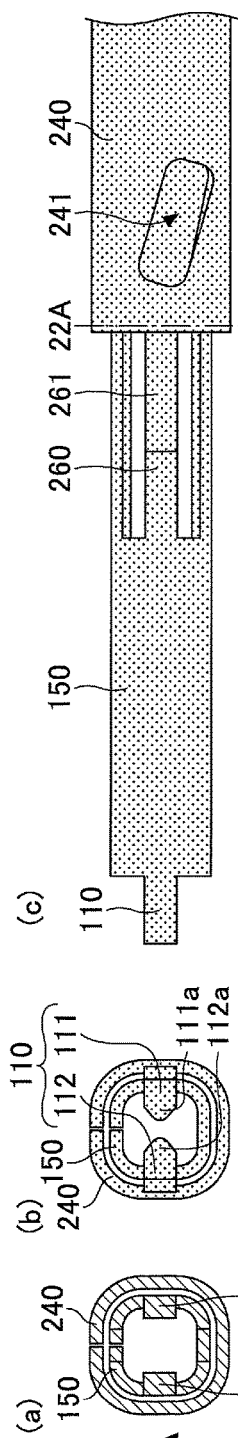
FIGS. 22A to 22D illustrate a contact process of the contact of the third embodiment.

At first, the front edges 111*a* and 112*a* of the contact terminals 111 and 112 are caused to contact the electrode pad. FIG. 22A illustrates a state where the front edges contact the electrode pad. In this state, the cantilever 260 does not contact the casing 240 and does not enter into the opening 241. Therefore, the terminals do not rotate.

Figure 22B:
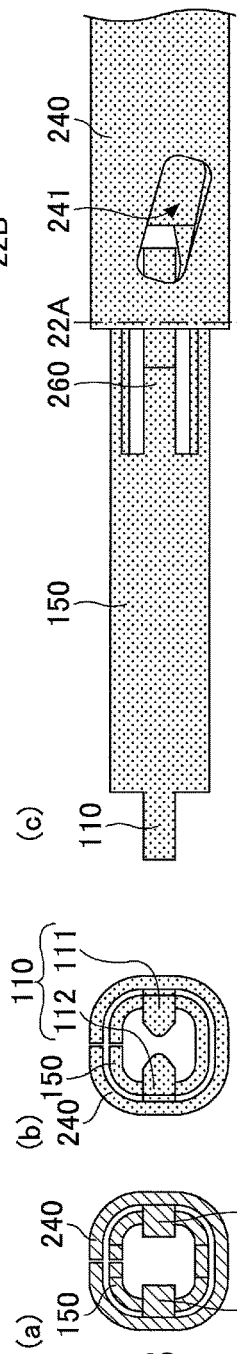

Next, as illustrated in FIG. 22B, the contact is pushed toward the electrode pad, and the cantilever 260 is inserted into the casing 240. In this state, the cantilever 260 contacts the casing 240 but does not enter into the opening 241. Therefore, the terminals do not rotate.

Figure 22C:
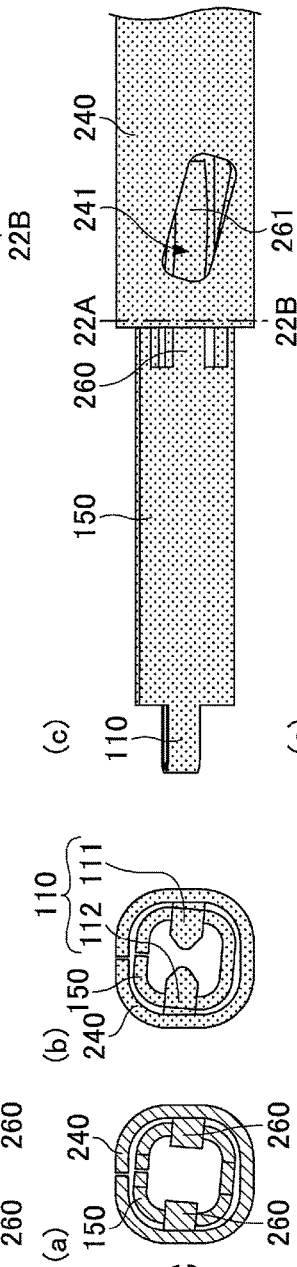

Next, as illustrated in FIG. 22C, the contact is further pushed, the cantilever 260 is further inserted into the casing 240, and the protrusion 261 enters into the opening 241. When the contact is further pushed from this state, the protrusion 261 further enters into the opening 241 and is guided along the opening 241. Because the protrusion 261 is guided by the slanted opening 241, the plunger 150 and the terminal 110 rotates, and the front edges 111*a* and 112*a* slide on the surface of the electrode pad while rotating on the surface so as to scrape off the oxide film on the electrode pad.

Figure 22D:
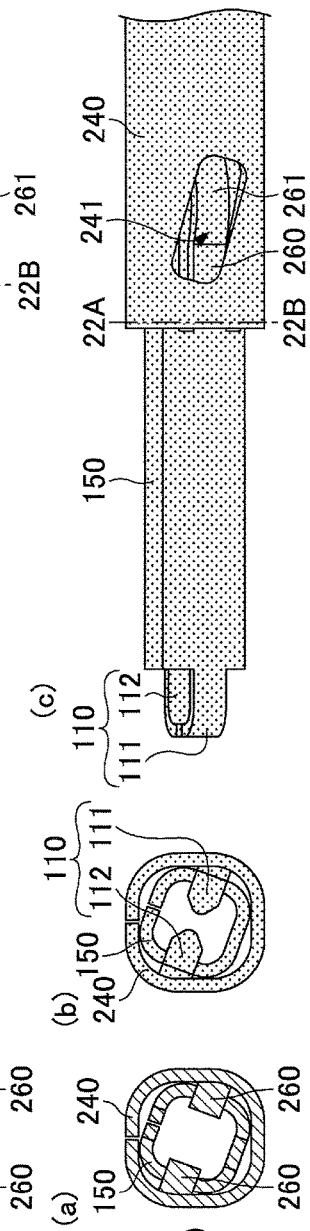

Next, as illustrated in FIG. 22D, the contact is further pushed, the cantilever 260 is further inserted into the casing 240, and the protrusion 261 further enters into the opening 241. At this time, because the front edges 111*a* and 112*a* further slides on the surface of the electrode pad while further rotating on the surface, the oxide film formed on the electrode pad is scraped away so as to expose the metal from the electrode pad. With this, because the part of the electrode pad where the oxide film is scraped away contacts the front edges 111*a* and 112*a*, the electrode pad is electrically connected to the contact.

In the state illustrated in FIG. 22D, because the outer faces of the cantilever 260 contact the inside of the casing 240, the electrical signal is transmitted from the front edges 111*a* and 112*a* through the terminals 111 and 112, the plunger 150, the cantilever 260, and the casing 240 to the second terminal 120.

The contents of the third embodiment other than the above are similar to those described in the second embodiment.

Fourth Embodiment

A contact of a fourth embodiment is described. Referring to FIGS. 23A and 23B, the contact of the fourth embodiment includes two bent portions 341 inside the casing 340, and the plunger 350 includes two grooves 351 each corresponding to one of the bent portions 341. FIG. 23A is a perspective view of a part having the first terminal 110 of the contact of the fourth embodiment. FIG. 23B is a perspective view in which the casing 340 illustrated in FIG. 23A is opened.

Figure 25A:
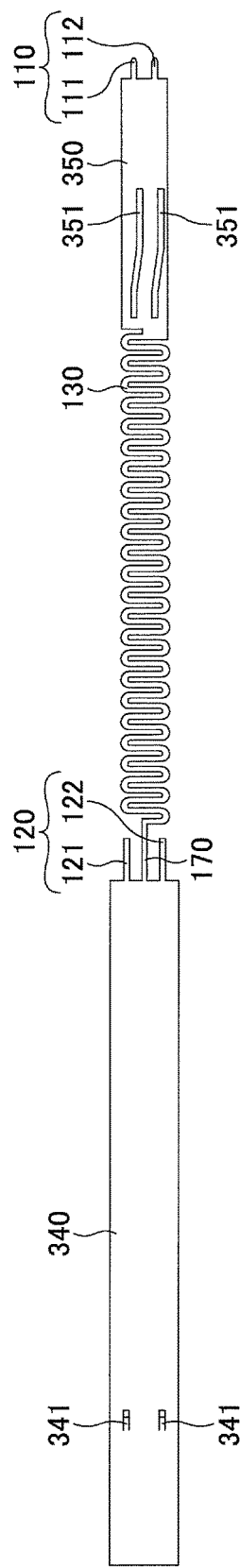
FIGS. 25A to 25C explain a manufacturing method of the contact of the fourth embodiment.
Figure 25B:
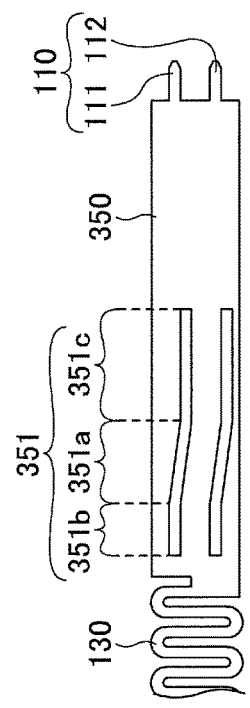

A groove 351 includes a slanted area 351*a* slanting relative to the longitudinal direction of the plunger 350, and straight areas 351*b* and 351*c*, which are formed on the front and back sides of the slanted area 351*a* and along the longitudinal direction of the plunger 350. Although two grooves 351 are formed in the plunger 350, because one of the grooves 351 is positioned on a face of the plunger 350 opposite to the face illustrated in FIG. 23B, the one groove does not appear in FIG. 23B. Referring to FIG. 25B, the slanted areas 351*a* slant in the same directions in a state of expanding the plunger 350. In the contact of the fourth embodiment, because the bent portions 341 enter inside the straight areas 351*b* and are guided by the slanted areas 351*a*, the terminals 111 and 112 rotate.

Referring to FIGS. 24A to 24C, processes of electrically connecting the contact with an electrode pad in the fourth embodiment are described. An electrical connection between the contact and the electrode pad is caused by pressing front edges 111*a* and 112*a* of the contact terminals 111 and 112 against the electrode pad. Referring to FIGS. 24A to 24E, the left views (a) are front views of the casing 340 and the plunger 350, and the right views (b) are side views thereof.

At first, the front edges 111*a* and 112*a* of the contact terminals 111 and 112 are caused to contact the electrode pad. FIG. 24A illustrates a state where the front edges contact the electrode pad. In FIG. 24A, the bent portions 341 formed inside the casing 340 enter inside the straight areas 351*b*.

Next, as illustrated in FIG. 24B, the contact is pushed toward the electrode pad. With this, the straight area 350 is inserted inside the casing 340. In the state illustrated in FIG. 24B, because the bent portions 341 exist in the straight areas 351*b*, the plunger 350 is further inserted into the casing 340 along the straight area 351*b* and the terminals 111 and 112 do not rotate.

Next, as illustrated in FIG. 24C, the contact is further pushed, the plunger 350 is further inserted into the casing 340 and the bent portions 341 further enter inside the slanted areas 351*a*. With this, as the plunger 350 enters inside the casing 340, the bent portions 341 are guided by the slanted areas 351*a* and the plunger 350 and the terminals 111 and 112 rotate. Therefore, the front edges 111*a* and 112*a* slide on the surface of the electrode pad while rotating on the surface so as to scrape off the oxide film formed on the electrode pad.

Next, as illustrated in FIG. 24D, the contact is further pushed, the plunger 350 is further inserted into the casing 340 and the bent portions 341 further enter into the slanted areas 351a. With this, the front edges 111a and 112a slide on the electrode pad while rotating on the surface so as to scrape off the oxide film formed on the surface of the electrode pad.

Next, as illustrated in FIG. 24E, the contact is further pushed, and the plunger 350 is further inserted into the casing 340 and the bent portions 341 further enter inside the slanted areas 351a. With this, the front edges 111a and 112a further slide on the surface of the electrode pad while further rotating on the surface.

As described, because the front edges 111a and 112a slide on the surface of the electrode pad while rotating on the surface, the oxide film formed on the surface of the electrode pad is scraped off so as to expose the metal from the electrode pad. With this, the electrode pad contacts the terminals 111 and 112, and the electrode pad and the contact are electrically connected.

Figure 25C:
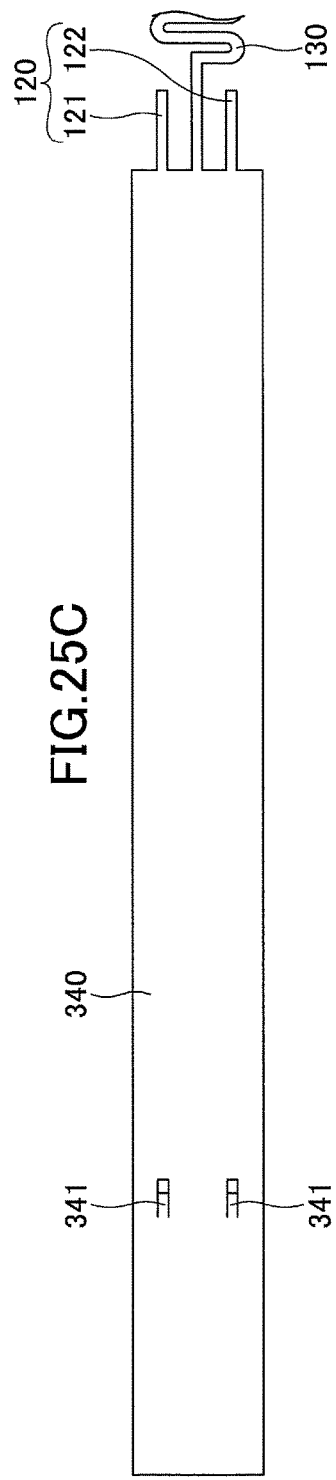

The contact of the fourth embodiment is manufactured by punching and bending a metal sheet. Specifically, the contact of the fourth embodiment is manufactured by forming the metal sheet illustrated in FIG. 25 by punching and bending the metal sheet. The bent portion 341 is formed by punching the metal sheet so as to be in a shape like a letter "U" and inwardly bending the U-shaped part. Further, the grooves 351 including the slanted areas 351a are formed in the center of the area for forming the plunger 350. FIG. 25A illustrates the metal sheet punched to manufacture the contact of the fourth embodiment. FIG. 25B is an enlarged view of and area of the metal sheet for forming the plunger 350. FIG. 25C is an enlarged view of the area of the metal sheet for forming the casing 340.

The contents of the fourth embodiment other than the above are similar to those described in the second embodiment.

In the above contact, even if the electrode pad is small, the oxide film formed on the surface of the electrode pad can be scraped off so as to electrically connect the contact to the electrode pad.

All examples and conditional language recited herein are intended for pedagogical purposes to aid the reader in understanding the embodiments and the concepts contributed by the inventor to furthering the art, and are to be construed as being without limitation to such specifically recited examples and conditions, nor does the organization of such examples in the specification relate to a showing of superiority or inferiority of the embodiments. Although the contact has been described in detail, it should be understood that the various changes, substitutions, and alterations could be made hereto without departing from the spirit and scope of the invention.

What is claimed is:

1. A contact comprising:
   a first terminal including a plurality of arms;
   a second terminal;
   a spring connecting the arms to the second terminal; and
   a casing covering the spring,
   wherein the arms outwardly protrude from one end of the casing,
   wherein an interval between the arms increases from a side of the casing to front edges of the arms,
   wherein when the arms are pushed toward the casing the arms are retracted into the casing and contact an inner side of the casing so that the interval between the arms decreases.

2. A contact for electrically connecting a first element to a second element, the contact comprising:
   a first terminal contacting the first element;
   a second terminal contacting the second element;
   a spring connecting the first terminal and the second terminal;
   a casing having a cylindrical shape;
   a cantilever disposed between the first terminal and the spring; and
   a rotation mechanism slanting relative to the longitudinal direction of the casing, and causing the cantilever to rotate relative to the casing so as to rotate the first terminal around an axial direction of the contact when the first terminal is pushed toward the casing.

3. The contact according to claim 2,
   wherein the cantilever slants relative to a longitudinal direction of the casing, and
   wherein, when the first terminal is pushed, the cantilever rotates relative to the casing so as to rotate the first terminal while contacting an inner side of the casing.

4. The contact according to claim 2,
   wherein the cantilever is formed in a shape of going along a longitudinal direction of the casing,
   wherein an opening slanting relative to the longitudinal direction of the casing is formed on the casing, and
   wherein, when the first terminal is pushed, the cantilever rotates along the opening so as to rotate the first terminal.

5. A contact for electrically connecting a first element to a second element, the contact comprising:
   a first terminal contacting the first element;
   a second terminal contacting the second element;
   a spring connecting the first terminal and the second terminal;
   a casing having a cylindrical shape; and
   a plunger disposed between the first terminal and the spring,
   wherein the plunger includes a groove slanted relative to a longitudinal direction of the casing,
   wherein the casing includes a bent portion, and when the first terminal is pushed, the bent portion moves along the groove so as to rotate the first terminal.

* * * * *